US008022757B2

(12) United States Patent
Takagi et al.

(10) Patent No.: US 8,022,757 B2
(45) Date of Patent: Sep. 20, 2011

(54) CLASS D POWER AMPLIFIER

(75) Inventors: Ryo Takagi, Kyoto (JP); Koji Takahata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/866,818

(22) PCT Filed: Dec. 9, 2009

(86) PCT No.: PCT/JP2009/070612
§ 371 (c)(1),
(2), (4) Date: Aug. 9, 2010

(87) PCT Pub. No.: WO2010/067823
PCT Pub. Date: Jun. 17, 2010

(65) Prior Publication Data
US 2010/0315163 A1    Dec. 16, 2010

(30) Foreign Application Priority Data

Dec. 10, 2008  (JP) .................................. 2008-314377

(51) Int. Cl.
    *H03F 3/38*  (2006.01)
(52) U.S. Cl. ...................... 330/10; 330/251; 330/207 A
(58) Field of Classification Search .................. 330/10, 330/251, 207 A
    See application file for complete search history.

(56) References Cited

U.S. PATENT DOCUMENTS

| 5,389,829 A | 2/1995 | Milazzo | |
| 7,057,456 B2* | 6/2006 | Taura et al. | 330/207 A |
| 7,078,964 B2* | 7/2006 | Risbo et al. | 330/10 |
| 7,221,216 B2* | 5/2007 | Nguyen | 330/10 |
| 7,312,654 B2* | 12/2007 | Roeckner et al. | 330/10 |
| 7,633,336 B2* | 12/2009 | Bean et al. | 330/10 |
| 7,777,562 B2* | 8/2010 | Wei et al. | 330/10 |
| 7,816,992 B2* | 10/2010 | Tanaka et al. | 330/311 |
| 7,932,778 B1* | 4/2011 | Cyrusian | 330/10 |
| 2003/0030486 A1 | 2/2003 | Noro et al. | |

FOREIGN PATENT DOCUMENTS

| JP | 06-152269 | 5/1994 |
| JP | 06-319197 | 11/1994 |
| JP | 2005-123784 | 5/2005 |
| JP | 2005-217583 | 8/2005 |
| JP | 2006-093764 | 4/2006 |
| JP | 2006-101022 | 4/2006 |
| JP | 2007-151098 | 6/2007 |
| JP | 2007-209038 | 8/2007 |
| JP | 2008-263519 | 10/2008 |

* cited by examiner

*Primary Examiner* — Patricia Nguyen
(74) *Attorney, Agent, or Firm* — Fish & Richardson P.C.

(57) ABSTRACT

A class D power amplifier includes: a signal input terminal for receiving an analog signal; an analog signal processing unit for amplifying the analog signal; an integrating circuit for integrating the analog signal received from analog signal processing unit; a PWM circuit for providing pulse width modulation to an integration signal received from the integrating circuit, and outputting a resulting pulse width modulation signal having a duty ratio falling within a first duty ratio range; a duty ratio adjusting circuit for adjusting the pulse width modulation signal, received from the PWM circuit, to have a pulse width falling within a second duty ratio range narrower than the first duty ratio range; a first driver and a second driver each for processing the pulse width modulation signal received from the duty ratio adjusting circuit; and power transistors.

22 Claims, 14 Drawing Sheets

FIG.1
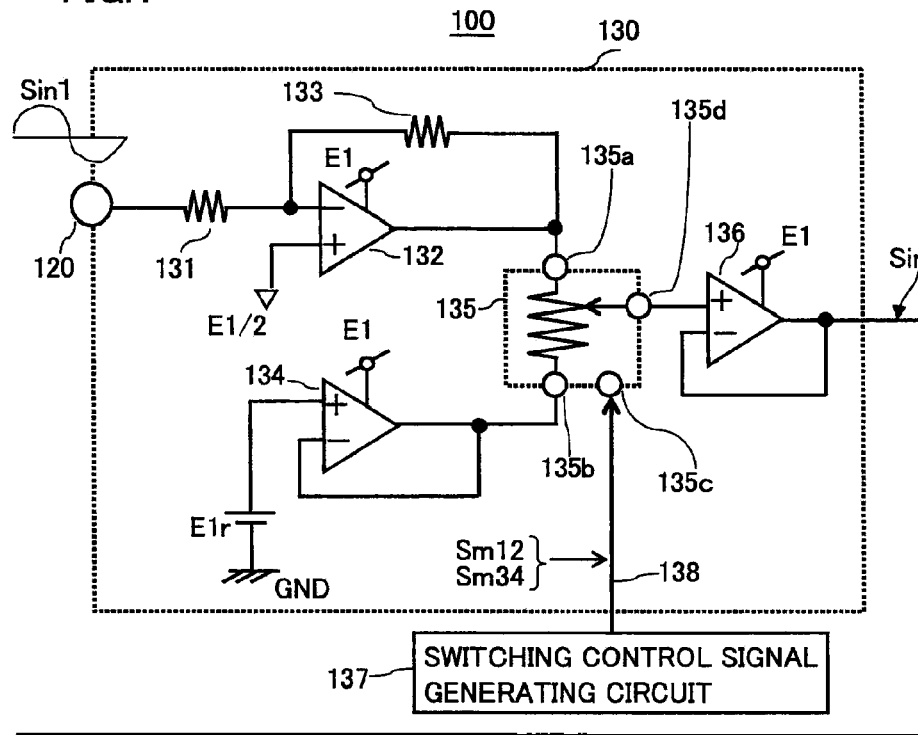
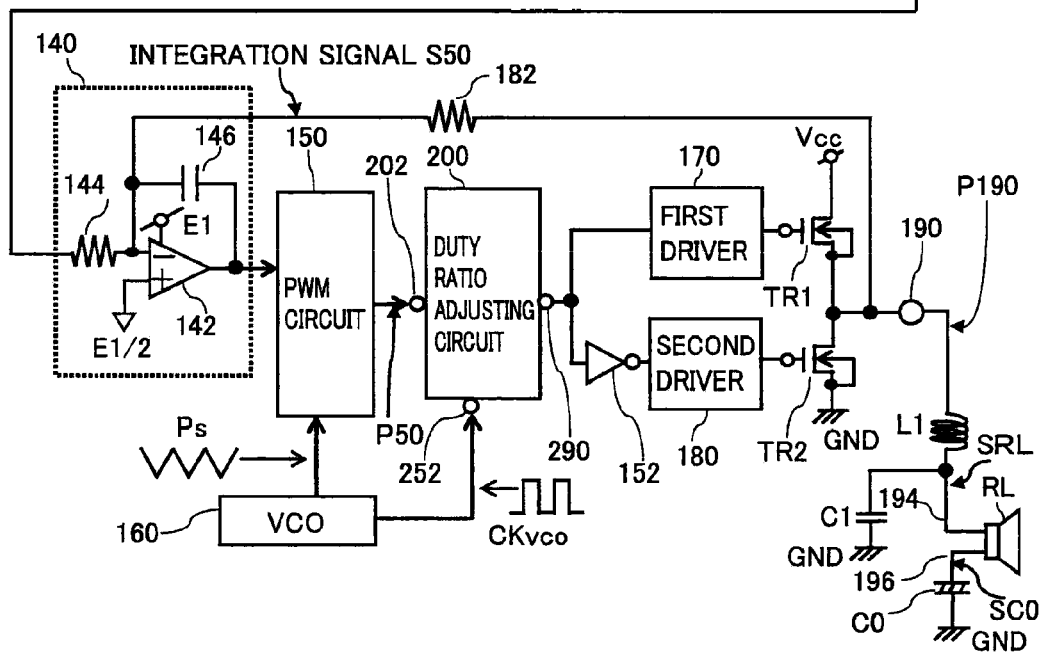

(a) PWM OUTPUT SIGNAL P390 (SIGNAL OUTPUT TERMINAL 390)

(b) ANALOG OUTPUT SIGNAL SRL SIGNAL WAVEFORM AT SPEAKER RL (SIGNAL LEADING LINE 194)

(c) SIGNAL SC0 (COUPLING CAPACITOR C0)

(d) TRANSIENT VOLTAGE ΔSRL (ACROSS SPEAKER RL)

CLASS D POWER AMPLIFIER

TECHNICAL FIELD

The present invention relates to a class D power amplifier, in particular, a class D power amplifier having a circuit function of reducing and eliminating generation of popping noise.

BACKGROUND ART

In response to demands for reduced number of components and use of a single power source for audio amplifying circuits in TVs, personal computers, AV receivers, car audio equipment, and the like, class D power amplifiers of single-ended type are used. In general audio amplifying circuits as well as these class D power amplifiers, unpleasant abnormal sound such as so-called popping noise may be generated upon power-on or power-off. To avoid such a problem, various countermeasures have been taken.

FIG. 13 schematically shows a conventional class D power amplifier of single-ended type. Class D power amplifier 300 has an integrated circuit portion 310. Integrated circuit portion 310 is literally interpreted as a portion in which respective electronic elements are integrated, but may be an aggregate of individual components. A signal input terminal 320 thereof receives an analog input signal Sin, which is then sent to a preamplifier 330. Preamplifier 330 outputs an analog signal to a PWM circuit 350. PWM circuit 350 is provided with an integrating circuit for integrating the analog signal, a triangular wave signal generating circuit for generating a triangular wave signal, and a comparator for comparing the integrated analog signal and the triangular wave signal. It should be noted that the term "PWM" is an abbreviation of "Pulse Width Modulation", which is well known for one having ordinary skills in the art. A method for modulating an analog signal using a triangular wave signal in such a PWM circuit is known as a separately-excited oscillation type PWM method. Apart from the separately-excited oscillation type PWM method, a self-excited oscillation type PWM method is also known, and is different from the separately-excited oscillation type PWM method in that the triangular wave signal can be output from the output side of the integrating amplifier even though no triangular wave signal generating circuit and comparator need to be provided, however, an oscillator and a Schmitt trigger circuit need to be provided, for example. Apart from these PWM methods, a class D power amplifier employing a delta sigma modulation method is also well known.

In FIG. 13, PWM circuit 350 outputs binarized signals P1, P2, which have been converted into a digital form and therefore have two levels, high and low levels. Binarized signals P1, P2 are respectively led to signal leading lines 342 and 344. Binarized signals P1, P2 are so-called PWM signals, and are respectively sent to a first driver 370 and a second driver 380.

First driver 370 and second driver 380 drive power transistors TR1, TR2, respectively. First driver 370 and second driver 380 are referred to as "high-side driver" and "low-side driver", respectively. Power transistor TR1 and power transistor TR2 are referred to as "high-side transistor" and "low-side transistor", respectively. These power transistors are connected in cascade, i.e., in series. Power transistor TR1 has a drain electrode supplied with, for example, power source voltage Vcc, and has a source electrode connected to, for example, the drain electrode of power transistor TR2, which has a source electrode connected to ground potential (GND). When power transistors TR1 and TR2 are switched from on to off and from off to on at the same timing, there exists a period during which both the transistors are on. Accordingly, a period needs to be provided during which both the high-side and low-side transistors are off. This period is called "dead time". The dead time, not shown in the figure, is produced by dead time producing circuits. The dead time producing circuits, not shown in the figure, are provided between PWM circuit 350 and first driver 370 as well as between PWM circuit 350 and second driver 380.

In a general class D power amplifier, a level shift circuit, not shown in the figure, is employed. Such a level shift circuit is prepared to convert an output voltage of the first driver 370 based on the source potential of the high-side transistor, power transistor TR1, into an amplitude voltage to be applied to the gate of power transistor TR1. No level shift circuit is required for second driver 380. It should be appreciated that the dead time producing circuits and the level shift circuit are not described in FIG. 13 because they are little relevant to the technical idea of the present invention.

Power transistors TR1 and TR2 have a common connection point, which is connected to a signal output terminal 390. Signal output terminal 390 is connected to an inductor L1 and a capacitor C1 both constituting a low pass filter. The low pass filter is prepared to demodulate the PWM signal having been sent to signal output terminal 390, into the original analog signal. Inductor L1 constituting the low pass filter has an inductance of, for example, several ten µH, whereas capacitor C1 has a capacitance value of approximately 1 µF. Further, a coupling capacitor C0, provided to cut off a direct-current component, is set to have a capacitance value of several hundred µF to several thousand µF. Inductor L1 and capacitor C1 have a common connection point, i.e., a signal leading line 194, to which one end of a speaker RL is connected. The other end thereof is connected to one end of coupling capacitor C0 via a signal leading line 196. The other end of coupling capacitor C0 is connected to ground potential GND.

FIG. 14(a)-FIG. 14(d) show various signals and various voltages at circuit elements of signal output terminal 390 shown in FIG. 13 and subsequent stages. FIG. 14(a) shows a PWM output signal P390 sent via signal output terminal 390. FIG. 14(b) shows an analog output signal SRL, which is lead to the common connection point of inductor L1 and capacitor C1, i.e., signal leading line 194, and exists at the one end of speaker RL. Analog output signal SRL is generated by inductor L1 and capacitor C1 integrating PWM output signal P390. Analog output signal SRL shown therein has an average voltage of Vcc/2.

FIG. 14(c) schematically shows a signal SC0 at the one end of coupling capacitor C0, i.e., signal leading line 196, when power source voltage is supplied. Signal SC0 thereat charges coupling capacitor C0, which has a relatively capacitance value, so it takes a relatively long time to reach a stable direct current voltage. In particular, in proportional to the capacitance value of coupling capacitor C0, it takes a relatively long time until the voltage therein is converged to a predetermined direct current voltage. It should be noted that a reference character X1 schematically represents a case where coupling capacitor C0 has a relatively small capacitance value whereas a reference character X2 schematically represents a case where coupling capacitor C0 has a relatively large capacitance value.

FIG. 14(d) schematically shows the waveform of a signal between the ends of speaker RL upon supply of power. Namely, FIG. 14(d) shows a transient voltage ΔSRL across speaker RL, and transient voltage ΔSRL corresponds to a difference in voltage between signal leading lines 194 and 196. Transient voltage ΔSRL causes current to flow in speaker RL, resulting in generation of popping noise. The magnitude and duration of transient voltage ΔSRL are proportional to the size of coupling capacitor C0. A reference character Y1 schematically represents a case where coupling capacitor C0 has a relatively small capacitance value, whereas a reference character Y2 schematically represents a case where coupling capacitor C0 has a relative large capacitance value. In order to eliminate such popping noise, there has been conventionally proposed various circuit devices and eliminating methods.

Patent Document 1 (Japanese Patent Laying-Open No. 2006-93764) describes popping noise and pumping phenomenon, and proposes a digital power amplifier capable of preventing occurrence thereof, having a single-end output, and implemented with an inexpensive configuration. Patent Document 1 is intended to prevent occurrence of popping noise upon power-on and power-off.

Patent Document 2 (Japanese Patent Laying-Open No. 2005-217583) discloses a technical idea concerned with a switching amplifier having a PWM pulse generator allowing for soft starting operation. According to Patent Document 2, a reference voltage generating circuit is provided which generates a reference voltage slowly increasing or decreasing in voltage value so as to slowly increase the duty ratio of a PWM pulse train, after supply of power. Based on the reference voltage and triangular wave signal, the pulse width thereof is increased to slowly increase the duty ratio thereof, thereby realizing soft starting operation upon supply of power. In this way, popping noise is prevented from being generated upon abrupt change in DC (direct current) potential of an output of the class D power amplifier. As with Patent Document 1, Patent Document 2 discloses a technical idea for preventing generation of popping noise upon power-on or power-off.

Patent Document 3 (Japanese Patent Laying-Open No. 2007-151098) suggests, for example in FIG. 1, a class D power amplifier with a single-ended output, and suggests a technical idea of preventing popping noise from being generated when the potential of a smoothing capacitor provided at a stage preceding a speaker is abruptly changed upon supply of power. Namely, Patent Document 3 is intended to prevent popping noise by controlling the potential using a PWM signal upon the supply of power and making switching to provide an output different from actual audio signal, whereby the potential of the smoothing capacitor provided at the stage preceding the speaker is controlled to change smoothly. Specifically, there are provided generating means for generating a pulse signal, which is constituted by a plurality of pulses, prior to output of an audio signal, and sending it to the smoothing capacitor provided at the stage preceding the speaker; and switching means for implementing switching between the audio signal and the pulses. The individual pulses are set so that a duty ratio of pulses preceding in time is smaller than that of pulses coming thereafter in time. In other words, the duty ratio for the pulses is slowly increased with passage of time, so the potential of the smoothing capacitor is not changed abruptly. In this way, the potential of the smoothing capacitor can be increased to a desired reference potential. It is reasonable to consider that the desired reference potential herein corresponds to the half of the height of the pulses, i.e., is as large as substantially the half of the power source voltage. Namely, the technical idea suggested by Patent Document 3 is intended to supply the smoothing capacitor with a pseudo PWM signal during a period of time from the moment of supply of power to the moment at which the potential of the smoothing capacitor reaches the half of the power source voltage, i.e., the moment at which the duty ratio thereof reaches 50%, and to supply the smooth capacitor with an actual audio signal once the duty ratio reaches 50%. As such, Patent Document 3 suggests a technical idea concerned with soft starting operation.

Patent Document 4 (Japanese Patent Laying-Open No. 06-152269) discloses a technical idea for reducing distortion of a reproduction signal caused by change in duty ratio of a PWM signal. In order to achieve this, the width of the PWM signal just before driving a load and the width of the PWM signal just after conversion are compared to each other, and the duty ratio thereof is corrected to match with that of the PWM signal just after conversion. In other words, Patent Document 4 is intended to correct change in duty ratio caused by delay or time lag of a switch's operation upon rising or falling of pulses during a period of time from the moment after the PWM conversion to the arrival to the load. The delay or time lag is caused by a driver and a final portion.

Patent Document 5 (Japanese Patent Laying-Open No. 2006-101022) provides a digital amplifier capable of preventing an audio characteristic from being deteriorated due to distortion of pulse waveform in the digital amplifier. In order to achieve this, a pulse width adjusting circuit is provided to adjust the pulse width of a PWM signal, generated by a PWM converter, in accordance with the level of an audio signal to be sent to a speaker.

Patent Document 6 (Japanese Patent Laying-Open No. 2005-123784) discloses a class D power amplifier employing a delta sigma modulation method for reducing noise resulting from switching between stopping and resuming of signal outputting in accordance with an instruction signal for mute-on/off.

FIG. 15 shows respective waveforms of an audio output and a PWM output upon switching from audio mute-off to mute-on, as shown in FIG. 10 of Patent Document 6. FIG. 15 illustrates a principle of generation of popping noise.

FIG. 15(a) schematically shows that an audio signal with a sine waveform is being output to a speaker during mute-off, and also shows noise, such as popping noise, generated at the moment of stopping the audio output upon switching from mute-off to mute-on.

FIG. 15(b) shows a waveform of a PWM output provided from a PWM modulator. FIG. 15(b) shows that during mute-off, the pulse width is changed according to the amplitude of the waveform of the audio output shown in FIG. 15(a) whereas in the mute-on state, the pulse width is changed to correspond to a signal waveform in which the pulse duty ratio is maintained at 50%. In other words, Patent Document 6 indicates that in the mute-off state, the pulse width of the PWM signal is changed with a certain level of correlation (continuity) in accordance with the waveform of the audio signal, whereas when the PWM signal is suddenly changed in waveform to have a duty ratio of 50% upon entering the mute-on state, the pulse width thereof is abruptly and significantly changed, with the result that the correlation (continuity) of changes in pulse width is highly likely to be lost.

Further, Patent Document 6 recites that change in pulse width is large not only when transition is made from the mute-off state to the mute-on state, but also when transition is made from the mute-on state to the mute-off state. It also suggests that noise such as popping noise is likely to be generated when changes in pulse width of the PWM signal are less correlated (continuous).

The present inventors have conducted various experiments to prevent and suppress generation of popping noise, and accordingly found that noise is also likely to be generated when the duty ratio of a PWM signal is around 0% and around 100%, besides the problems disclosed in Patent Documents 1-6.

PRIOR ART DOCUMENTS

Patent Documents

Patent Document 1: Japanese Patent Laying-Open No. 2006-93764

Patent Document 2: Japanese Patent Laying-Open No. 2005-217583

Patent Document 3: Japanese Patent Laying-Open No. 2007-151098

Patent Document 4: Japanese Patent Laying-Open No. 06-152269

Patent Document 5: Japanese Patent Laying-Open No. 2006-101022

Patent Document 6: Japanese Patent Laying-Open No. 2005-123784

SUMMARY OF THE INVENTION

Problems to be Solved by the Invention

In view of the technical ideas disclosed in Patent Documents 1, 2, 3, 4, 5 and 6 and in order to achieve elimination of popping noise which is likely to be generated when a PWM signal has a duty ratio of around 0% and around 100%, an object of the present invention is to provide a class D power amplifier allowing for reduced popping noise.

Means for Solving the Problems

A class D power amplifier of the present invention includes:
  (a) a signal input terminal for receiving an analog signal; and
  (b) an analog signal processing unit, connected to the signal input terminal, for processing the analog signal,
  the analog signal processing unit including
    (b1) a first amplifier, connected to the signal input terminal, for amplifying the analog signal,
    (b2) a second amplifier for outputting a direct current voltage as an output signal,
    (b3) a signal switching circuit, which has a first terminal and a second terminal for respectively receiving the output signals of the first amplifier and the second amplifier, and which receives a switching control signal having a predetermined time, and
    (b4) a third amplifier having an input terminal and an output terminal connected to an output terminal of the signal switching circuit and the integrating circuit respectively,
  (c) the output signal of one of the first amplifier and the second amplifier being sent to the output terminal of the third amplifier in accordance with the switching control signal after passage of the predetermined time.

According to the above-described configuration, the signal switching circuit is not switched abruptly but is switched slowly within the predetermined time, thereby preventing generation of abnormal sound, in particular, popping noise, which is likely to occur upon signal switching.

Another class D power amplifier of the present invention includes:
  (a) a signal input terminal for receiving an analog signal;
  (b) an analog signal processing unit, connected to the signal input terminal, for processing the analog signal;
  (c) an integrating circuit for integrating the analog signal output from the analog signal processing unit;
  (d) a pulse width modulation circuit for providing pulse width modulation (PWM) to an integration signal output from the integrating circuit, so as to generate a binarized digital signal having a duty ratio falling within a first duty ratio range;
  (e) a duty ratio adjusting circuit for adjusting the duty ratio of the pulse width modulation signal, which is an output signal of the pulse width modulation circuit, to fall within a second duty ratio range narrower than the first duty ratio range;
  (f) a driver circuit which receives an output signal of the duty ratio adjusting circuit;
  (g) a power transistor connected to the driver circuit; and
  (h) a signal output terminal, which is connected to the power transistor and via which the pulse width modulation signal having the duty ratio adjusted is output.

According to the above-described configuration, a PWM signal having a duty ratio falling within a first range of 0%-100% is adjusted to have a duty ratio falling within a narrower second duty ratio range of for example 3%-97%, thereby preventing generation of abnormal sound, in particular, popping noise, which is likely to occur when the duty ratio thereof is around 0% and around 100%.

Still another class D power amplifier of the present invention includes:
  (a) a signal input terminal for receiving an analog signal;
  (b) an analog signal processing unit, connected to the signal input terminal, for processing the analog signal,
  the analog signal processing unit including
    (b1) a first amplifier, connected to the signal input terminal, for amplifying the analog signal,
    (b2) a second amplifier for outputting a predetermined direct current voltage,
    (b3) a signal switching circuit, which has a first terminal and a second terminal for receiving the output signals of the first amplifier and the second amplifier respectively, and which receives a switching control signal set at a predetermined time, and
    (b4) a third amplifier having an input terminal and an output terminal respectively connected to an output terminal of the signal switching circuit and an integrating circuit for integrating the analog signal,
    (b5) the output signal of one of the first amplifier and the second amplifier being sent to the output terminal of the third amplifier in accordance with the switching control signal after passage of the predetermined time,
  the class D power amplifier further including:
  (c) a pulse width modulation circuit for providing pulse width modulation (PWM) to an integration signal output from the integrating circuit, so as to generate a binarized digital signal having a duty ratio falling within a first duty ratio range;
  (d) a duty ratio adjusting circuit for adjusting the duty ratio of the pulse width modulation signal, which is an output signal of the pulse width modulation circuit, to fall within a second duty ratio range narrower than the first duty ratio range;
  (e) a driver circuit which receives an output signal of the duty ratio adjusting circuit;
  (f) a power transistor connected to the driver circuit; and
  (g) a signal output terminal, which is connected to the power transistor and via which the pulse width modulation signal having the duty ratio adjusted is output.

According to the above-configuration, the signal switching circuit is not switched abruptly but is switched slowly in the predetermined time, thereby preventing generation of abnormal sound, in particular, popping noise, which is likely to occur upon signal switching. Further, a PWM signal having a duty ratio falling within a first range of 0%-100% is adjusted to have a duty ratio falling within a range of for example 3%-97%, thereby also preventing generation of abnormal sound, in particular, popping noise, which is likely to occur when the duty ratio thereof is around 0% and around 100%.

Effects of the Invention

A class D power amplifier of the present invention is capable of preventing generation of abnormal sound which is likely to occur upon abrupt signal switching, because a signal switching circuit therein is switched slowly for mute-on/off within a predetermined period of time. A PWM circuit therein provides pulse width modulation to an analog signal to obtain a binarized signal. Thereafter, in the case where the duty ratio thereof is around 0%, a duty ratio adjusting circuit adjusts the duty ratio to be higher than that. On the other hand, in the case where the duty ratio is around 100%, the duty ratio adjusting circuit adjusts the duty ratio to be lower than that. Accordingly, popping noise occurring when the duty ratio is around 0% and 100% can be eliminated.

BRIEF DESCRIPTION OF THE DRAWINGS

FIG. 1 is a circuit block diagram of a class D power amplifier according to a first embodiment of the present invention.

MODES FOR CARRYING OUT THE INVENTION

First Embodiment

Figure 2:
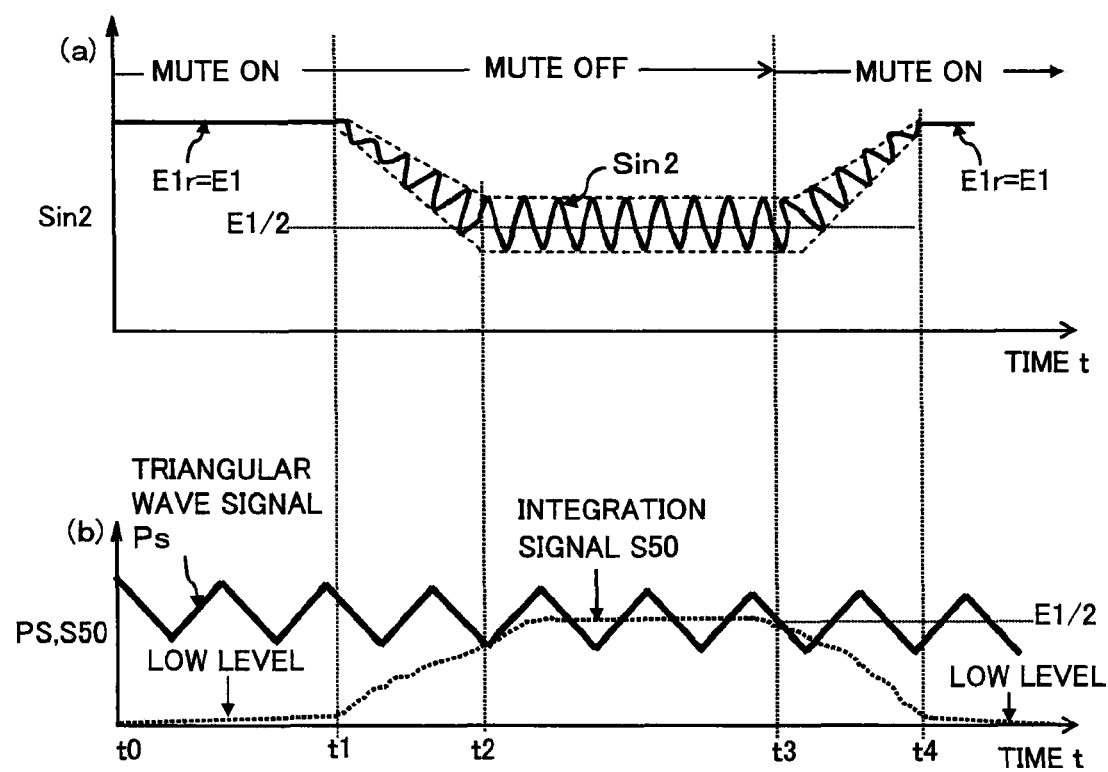
FIG. 2 is a waveform diagram of signals in main portions in FIG. 1 in the first embodiment of the present invention.

FIG. 1 shows a circuit block diagram of a class D power amplifier according to a first embodiment of the present invention. Specifically, FIG. 1 shows a class D power amplifier of single-ended type in which one signal output terminal is connected to one speaker. Class D power amplifier 100 has a signal input terminal 120 for receiving an analog input signal Sin1, an analog signal processing unit 130 for processing the analog signal, an integrating circuit 140, a PWM circuit 150, a VCO 160, a duty ratio adjusting circuit 200, a first driver 170, a second driver 180, power transistors TR1, TR2, and a signal output terminal 190. Signal output terminal 190 is connected to an inductor L1, a capacitor C1, a coupling capacitor C0, and a speaker RL. Inductor L1 and capacitor C1 constitute a low pass filter, and coupling capacitor C0 is provided to cut off a direct-current component. The order of inductance of inductor L1 is selected to be several ten μH, the capacitance value of capacitor C1 is selected to be approximately 1 μF, and the capacitance of coupling capacitor C0 is selected to be several hundred μF to several thousand μF. Further, class D power amplifier 100 according to the present invention has a switching control signal generating circuit 137.

Analog signal processing unit 130 has amplifiers 132, 134, 136, and a signal switching circuit 135. These three amplifiers are supplied with power source voltages E1 of the same magnitude. Signal input terminal 120 receives analog input signal Sin1, which is then sent to the inverting input terminal (−) of amplifier 132 via a resistor 131. The non-inverting input terminal (+) of amplifier 132 is supplied with a direct current voltage E1/2, which is as large as the half of each power source voltage E1. Amplifier 132 constitutes a negative feedback type inverting amplifier circuit whose degree of amplification is determined by resistors 131 and 133. Amplifier 132 has an output terminal connected to a first terminal 135a of signal switching circuit 135. In this way, the analog signal is always supplied to first terminal 135a irrespective of the on or off operation state of signal switching circuit 135. In the case where the analog signal is an audio signal, the signal has a frequency of substantially 20 Hz to 20 KHz.

Amplifier 134 operates as a voltage follower irrespective of the on or off operation state of signal switching circuit 135, and has an output terminal connected to second terminal 135b of signal switching circuit 135. In this way, a second terminal 135b of signal switching circuit 135 is always supplied with a reference voltage E1r, which is a direct current voltage, irrespective of the on or off operation state of signal switching circuit 135. Reference voltage E1r is selected to be equal to power source voltage E1, i.e., E1r=E1. Namely, the voltage supplied from amplifier 134 to second terminal 135b is selected to be as large as power source voltage E1 for each of amplifiers 134, 132.

Signal switching circuit 135 has a control terminal 135c to which switching control signals Sm12, Sm34 are applied from switching control signal generating circuit 137 via a signal leading line 138. Switching control signals Sm12, Sm34 are signals for switching the circuit operation from mute-on to mute-off and from mute-off to mute-on, respectively. An output terminal 135d thereof outputs either the analog signal supplied to first terminal 135a, or direct current voltage E1r supplied to second terminal 135b. In other words, when output terminal 135d selects first terminal 135a, amplifier 136 transmits an analog signal Sin2 via the output terminal of amplifier 136 to a speaker RL, which is disposed at a subsequent stage. On the other hand, when output terminal 135d selects second terminal 135b, analog input signal Sin1 is not supplied to amplifier 136. Accordingly, signal transmission to speaker RL of the subsequent stage is blocked. This takes place in the mute-on operation mode.

When output terminal 135d of signal switching circuit 135 is switched to select second terminal 135b from first terminal 135a, the operation mode is switched from the mute-off operation mode to the mute-on operation mode. On the other hand, when it is switched to select first terminal 135a from second terminal 135b, the operation mode is switched from the mute-on operation mode to the mute-off operation mode.

Signal switching circuit 135 is controlled by switching control signals Sm12, Sm34 applied from switching control signal generating circuit 137. Switching control signals Sm12 and Sm34 are applied for a predetermined time from switching control signal generating circuit 137 to control terminal 135c via signal leading line 138. Switching control signals Sm12, Sm34 are to switch the circuit operation from mute-on to mute-off and from mute-off to mute-on, respectively. Further, the mode is switched from/to mute-on to/from mute-off slowly, not abruptly, for a predetermined period of time. The predetermined period of time corresponds to each of mode switching times tm12, tm34. Mode switching times tm12, tm34 are normally set to be a period of time of several ten ms to several hundred ms. Mode switching times tm12, tm34 have a predetermined length as such, thus achieving prevention of generation of abnormal sound, i.e., popping noise, which is likely to be generated upon switching the mode, for example, between mute-on and mute-off.

The analog signal or the direct current voltage, sent to output terminal 135d of signal switching circuit 135, is transmitted to amplifier 136. As apparent from the above description, the state in which the analog signal is transmitted to amplifier 136 corresponds to the mute-off operation mode, whereas the state in which direct current voltage E1r (=E1) is transmitted to amplifier 136 corresponds to the mute-on operation mode. It should be noted that power source voltage E1 of amplifier 136 is set to be equal to power source voltages E1 supplied to respective amplifiers 132, 134. Amplifier 136 also has a function to serve as a buffer between signal switching circuit 135, which is a preceding stage, and integrating circuit 140, which is a next stage.

In the mute-off operation mode, the analog signal from amplifier 136 is sent to one end of a resistor 144 constituting integrating circuit 140. The other end of resistor 144 is connected to the inverting input terminal (−) of an amplifier 142. Resistor 144 as well as a capacitor 146 are provided to integrate the analog signal. A product of constants thereof determines an integration time constant. To the non-inverting input terminal (+) of amplifier 142, there is applied a voltage adjusted so that the direct current voltage of signal output terminal 190 will be as large as Vcc/2. In this way, the direct current voltage of signal output terminal 190 is maintained to be Vcc/2.

Integrating circuit 140, specifically, amplifier 142, outputs an integration signal S50 to PWM circuit 150. PWM circuit 150 is constructed in accordance with the separately-excited oscillation type PWM method. Since a PWM circuit employing the separately-excited oscillation type PWM method requires a triangular wave signal, VCO 160 is provided to generate a triangular wave signal Ps. Basically, PWM circuit 150 does not necessarily require a rectangular wave signal, but in the present invention, VCO 160 generates a rectangular wave signal, a VCO clock signal CKvco, to be supplied to duty ratio adjusting circuit 200 described below, in addition to triangular wave signal Ps. VCO clock signal CKvco is a rectangular wave signal having rising and falling edges that are respectively synchronized with the maximum value and minimum value of triangular wave signal Ps, and having a duty ratio of substantially 50%.

PWM circuit 150 receives the two signals and outputs one signal. One of the received signals is integration signal S50 sent from integrating circuit 140, and the other is triangular wave signal Ps. The levels of these two signals are compared by a comparator provided in PWM circuit 150 but not shown in the figure, and a binarized signal, obtained through pulse width modulation based on the comparison result, is output as a PWM signal P50.

PWM signal P50 thus output from PWM circuit 150 is sent to an input terminal 202 of duty ratio adjusting circuit 200. Duty ratio adjusting circuit 200 is one of features of the present invention, and has such a circuit configuration that receives two signals and outputs one signal.

Input terminal 202 of duty ratio adjusting circuit 200 receives PWM signal P50 from PWM circuit 150. Another input terminal 252 of duty ratio adjusting circuit 200 receives VCO clock signal CKvco generated by VCO 160. VCO clock signal CKvco is a rectangular wave signal synchronized with triangular wave signal Ps. Duty ratio adjusting circuit 200 outputs a signal via output terminal 290. The signal thus output via output terminal 290 is substantially the same as PWM signal P50 having been input to input terminal 202, but in the case where the duty ratio thereof is around 0% and around 100%, PWM signal P50 has been adjusted to have a predetermined duty. Specifically, a PWM signal P50 having a duty ratio of for example 3% or smaller, i.e., a duty ratio of 0%-3%, is uniformly corrected to be a PWM signal having a duty ratio of substantially 3%. Similarly, a PWM signal P50 having a duty ratio of 97% or greater, i.e., a duty ratio of 97%-100%, is uniformly corrected to be a PWM signal having a duty ratio of substantially 97%. However, PWM signals P50 each having a duty ratio of for example 3%-97% are never adjusted for their duty ratios. As such, PWM signals P50 having duty ratios of 0% and 100% are adjusted to have duty ratios of 3% and 97%, respectively.

As described above, duty ratio adjusting circuit 200 does not adjust all the PWM signals having duty ratios falling within the range of 0%-100%, but adjusts ones having duty ratios falling within the predetermined ranges. Further, the adjustment of duty ratio is performed in the mute-off operation mode. Therefore, duty ratio adjusting circuit 200 is applicable to a circuit configuration in which amplifier 134 and signal switching circuit 135 described above are not provided, i.e., a circuit configuration in which first terminal 135a and output terminal 136 are short-circuited. In other words, it can be applied to a class D power amplifier having no mute-on/off function. It should be noted that duty ratio adjusting circuit 200 operates during mute-on and upon mute switching. During mute-on, the duty ratio thereof is adjusted to 3% but first driver 170 and second driver 180 do not cause power transistors TR1, TR2 to operate. Upon mute switching, the duty ratio of PWM signal P50 is adjusted from 3% to 50% or from 50% to 3%.

The range of the PWM signal's duty ratio adjusted by duty ratio adjusting circuit 200 can be adjusted by means of signal processing and logical processing of VCO clock signal CKvco provided to input terminal 252. Details thereof will be described below with regard to FIGS. 4 and 5.

Duty ratio adjusting circuit 200 sends, from its output terminal 290 to first driver 170 and second driver 180, the PWM signal having the adjusted duty ratio. In a signal path between output terminal 290 and second driver 180, an inverter 152 is provided to supply thereto a PWM signal having a polarity opposite to that of the PWM signal supplied to first driver 170.

Since first driver 170 and second driver 180 are not directly relevant to the technical idea of the present invention, they are illustrated in a very simplified manner for ease of explanation. One having ordinary skills in the art can readily conceive that first driver 170 includes a dead time producing circuit, a level shift circuit, and a high-side gate driver, all of which are not described in the figure. Likewise, he/she can relatively readily conceive that second driver 180 includes a dead time producing circuit and a low-side gate driver. In the first embodiment of the present invention, conventional drivers can be employed for the drivers of these types.

First driver 170 and second driver 180 output the PWM signals to power transistors TR1, TR2, respectively. Power transistor TR1 has a drain electrode supplied with for example a power source voltage Vcc, and has a source electrode connected to for example the drain electrode of power transistor TR2. Power transistor TR2 has a source electrode connected to a ground potential (GND). The power transistors are connected in cascade, i.e., in series, and have a common connection point connected to signal output terminal 190.

Signal output terminal 190 receives a PWM output signal P190 having been through the pulse width modulation. PWM output signal P190 is fed back to the input side of PWM circuit 150 via a feedback resistor 182. By providing negative feedback from the output side to the input side of class D power amplifier, distortion can be reduced in the entire class D power amplifier.

Between signal output terminal 190 and ground potential GND, the low pass filter, the speaker, and the coupling capacitor are connected in series. To constitute the low pass filter, inductor L1 and capacitor C1 are connected therebetween. The low pass filter is provided to demodulate the PWM signal having been sent via signal output terminal 190, into the original analog signal, i.e., the signal before having been modulated. Inductor L1 has an inductance of for example several ten µH, and capacitor C1 has a capacitance value of approximately 1 µF. The impedance of speaker RL can be selected from for example 4Ω, 6Ω, 8Ω, and 16Ω. Further, in order to cut off a direct-current component, the capacitance value of coupling capacitor C0 is selected to be several hundred µF to several thousand µF. Inductor L1 and capacitor C1 have a common connection point connected to one end of speaker RL. The other end of speaker RL is connected to one end of coupling capacitor C0. The other end of coupling capacitor C0 is connected to the ground potential (GND).

PWM output signal P190 exists at signal output terminal 190, analog signal SRL exists at the one end of speaker RL, i.e., signal leading line 194, and signal SC0 exists at the other end thereof, i.e., the one end (signal leading line 196) of coupling capacitor C0.

FIG. 2 is a waveform diagram of the signals in the main portions of FIG. 1 in the first embodiment of the present invention. Specifically, FIG. 2 schematically shows changes of the signals with passage of time at part of respective nodes of analog signal processing unit 130, integrating circuit 140, and VCO 160 in class D power amplifier 100. FIG. 2(a) shows changes of analog signal Sin2 at the output terminal of analog signal processing unit 130, i.e., at the output terminal of amplifier 136 when transition is made from mute-on to mute-off, and then transition is made from mute-off, the normal operation state, to mute-on.

A period of time t0 to t1 corresponds to the state of mute-on. Analog signal Sin2 at the output terminal of amplifier 136 during this period only has a direct current voltage, and is substantially equal to power source voltage E1. A period of time t1 to t2 corresponds to a transition period for disabling the mute-on. In this period, the effect of mute-on is gradually weaken, and can be therefore regarded as a soft mute period. Since the effect of muting is gradually disabled in this period, analog signal Sin2 has an alternating current component of a signal gradually superimposed on the direct current voltage thereof. On this occasion, the direct current voltage, which is as large as power source voltage E1, is gradually decreased to the half of power source voltage E1. At time t2, the muting is completely disabled and the receiving state is therefore brought into a normal receiving state. During a period of time t2 to t3, the muting is completely disabled and the receiving state is normal. Analog signal Sin2 in this period has a direct current voltage of E1/2 on which a signal having an alternating current component is superimposed. A period of time t3 to t4 is a transition period for making transition to mute-on from mute-off, i.e., from the normal receiving state. The period of time t3 to t4 is set to be substantially as long as the period of time t1 to t2. In this period, the amplitude value of the alternating current component in analog signal Sin2 is gradually decreased. At time t4, analog signal Sin2 only has the same direct current voltage E1 again as it had during the period of time t0 to t1. A period of time t4 and thereafter is a continuous period of mute-on. It should be noted that the soft mute time periods, the period of time t1 to t2 and the period of time t3 to t4, are set by switching control signal generating circuit 137

Switching control signals 138 for controlling on/off of muting are generated by switching control signal generating circuit 137. Switching control signal generating circuit 137 may be constituted by combining, for example, a resistor ladder and a counter, or switching control signals 138 can be generated using a charge pumping circuit. Further, a switching control signal having a sawtooth waveform or a triangular waveform can be relatively readily generated by charging/discharging a capacitor or by a mirror integrating circuit that employs an operational amplifier.

FIG. 2(b) schematically shows changes of integration signal S50 from integrating circuit 140 and triangular wave signal Ps from VCO 160, with passage of time. It should be noted that integration signal S50 shown in FIG. 2(b) does not necessarily represent an actual integration signal. For ease of explanation, the average voltage of a PWM signal having a duty ratio of 50% is schematically shown therein.

Triangular wave signal Ps shown in FIG. 2(b) is generated by VCO 160, which is electrically separated from analog signal processing unit 130 and integrating circuit 140, and therefore is not directly affected by mute-on and mute-off Hence, triangular wave signal Ps does not depend on the changes with passage of time t, and is always generated constantly and continuously. In contrast, integration signal S50 depends on the circuit operation states of analog signal processing unit 130 and integrating circuit 140 that depend on on/off of muting. Hence, upon transition from mute-on to mute-off, integration signal S50 is gradually increased from a low level from time t1. At time t2, it reaches substantially a predetermined level. When integration signal S50 reaches the predetermined level, PWM circuit 150 is brought into a normal operation period. Such circuit configurations and circuit operations allow the duty ratio to reach 50% from 0% slowly as compared with circuit configurations in which no soft mute period of time t1 to t2 is provided, thereby eliminating generation of popping noise, which is likely to occur upon switching of the operation mode from mute-on to mute-off.

The same holds true for a case of switching the operation mode from mute-off, i.e., the normal receiving state, to mute-on. Specifically, in the period of time t3 to t4 for switching the operation mode from mute-off to mute-on, integration signal S50 is slowly decreased and is converged to the low level in the end. As such, the duty ratio of the PWM signal can be changed slowly from 50% to 0%. In this way, generation of popping noise likely to occur upon mute-on/off can be eliminated.

As described above, in the present invention, the operations of switching the operation mode from/to mute-on to/from mute-off are not performed abruptly but are performed slowly to make a transition to a predetermined operation, so there can be eliminated generation of popping noise that is likely to occur upon abrupt switching.

Figure 3A:
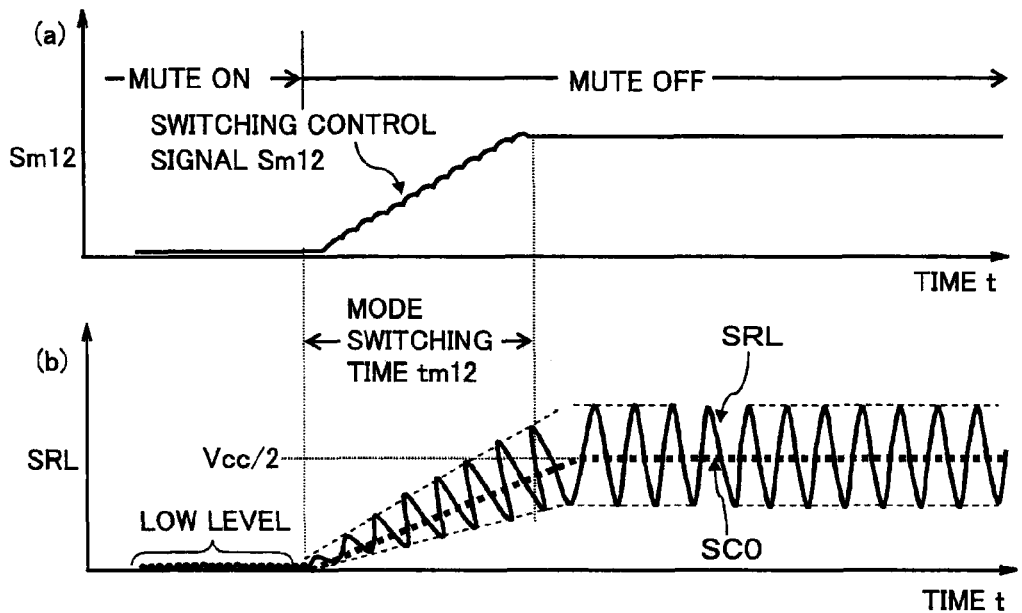
FIG. 3A shows transition of voltages in waveform in a speaker and a coupling capacitor when switching a mode from mute-on to mute-off in the first embodiment of the present invention.
Figure 3B:
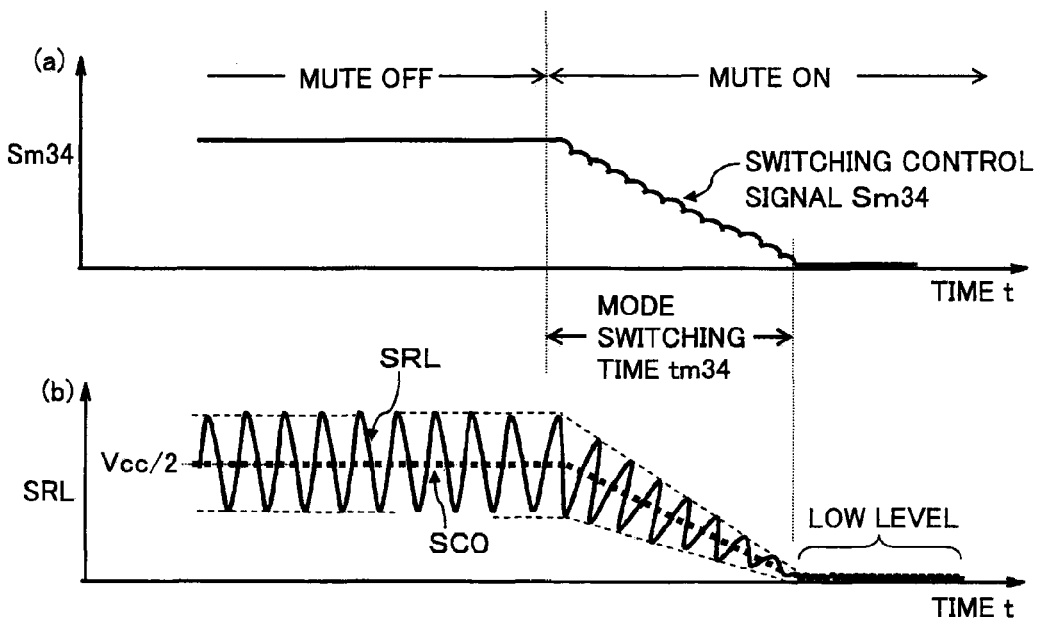
FIG. 3B shows transition of voltages in waveform in the speaker and the coupling capacitor when switching the mode from mute-off to mute-on in the first embodiment of the present invention.

FIGS. 3A, 3B illustrate circuit operations for mute-on/off. In particular, the waveforms of the signals at the respective ends of speaker RL during mute-on/off are schematically shown. FIG. 3A shows a waveform diagram of the signals in FIG. 1 upon switching the operation mode from mute-on to mute-off, whereas FIG. 3B shows a waveform diagram of the signals in FIG. 1 upon switching the operation mode from mute-off to mute-on.

FIG. 3A(*a*) schematically shows switching control signal Sm12 applied from switching control signal generating circuit 137 to control terminal 135*c* of signal switching circuit 135 via signal leading line 138, whereas FIG. 3A(*b*) schematically shows the signals at the respective ends of speaker RL. In the mute-on operation mode, signal SRL at the one end of speaker RL as well as signal SC0 at the other end of speaker RL, i.e., at the one end of coupling capacitor C0 are both at low levels. As described above, when switching the operation mode from mute-on to mute-off, signal switching circuit 135 is not switched abruptly but is switched slowly for a predetermined period of time, i.e., for a period of a mode switching time tm12. The period of mode switching time tm12 corresponds to the period of time t1 to t2 shown in FIG. 2. Further, the period of mode switching time tm12 is set to fall within a range from several ten ms to several hundred ms. If the period of time is set too short, generation of popping noise cannot be eliminated completely. In contrast, too long a period of switching time between the mute-on/off operations is not preferable because the entire circuit operation becomes unnatural. It was found that in the first embodiment of the present invention, the period of mode switching time tm12 ranges from 50 ms to 150 ms, and is more preferably approximately 90 ms.

Now, the period of mode switching time tm12 was set to range from 50 ms to 150 ms as described above. A circuit configuration was adopted in which a signal having a level transitioning with for example the eleventh power of 2, i.e., 2048 steps within this period of time was applied to signal switching circuit 135. The waveform of switching control signal Sm12 was such that its signal level would be changed slowly within the period of mode switching time tm12.

It was confirmed that when switching control signal Sm12 shown in FIG. 3A(*a*) was applied to signal switching circuit 135, the signal shown in FIG. 3A(*b*) appear at respective ends of speaker RL. Referring to FIG. 3A(*b*), it was confirmed that signal SRL was at the one end of speaker RL, i.e., signal leading line 194, and signal SC0 was at the one end of coupling capacitor C0, i.e., the other end of speaker RL and signal leading line 196. In particular, it was found that signal SC0 at the one end of coupling capacitor C0 was increased slowly during the period of mode switching time tm12 to significantly reduce generation of popping noise, which occurs due to abrupt potential change of coupling capacitor C0.

FIG. 3B shows the waveforms of the signals at respective ends of speaker RL upon switching the operation mode from mute-off to mute-on. The waveforms of the signals shown in FIG. 3B are basically similar to those shown in FIG. 3A. Specifically, signals SRL, SC0 are decreased slowly within a period of mode switching time tm34 when switching is made to switching control signal Sm34 and are converged to the low level in the end. It should be noted that the period of mode switching time tm34 corresponds to the period of time t3 to t4 shown in FIG. 2. In this way, generation of popping noise, which is likely to occur upon mute-on/off, can be eliminated. Further, such circuit operations allow not only for mute-on/off but also for soft starting operation with the power source voltage, thereby eliminating popping noise, which is likely to occur upon supplying and stopping supplying the power source voltage. It should be noted that the period of mode switching time tm34 is set to fall within the range of 50 ms to 150 ms as with that of mode switching time tm12 shown in FIG. 3A(*a*).

Heretofore, there has been described the circuit function of eliminating popping noise that is likely to occur upon mute-on/off Described next is a circuit function of eliminating popping noise that occurs when the duty ratio of the PWM signal is around 0% and around 100%. This was found by the present inventors.

Figure 4:
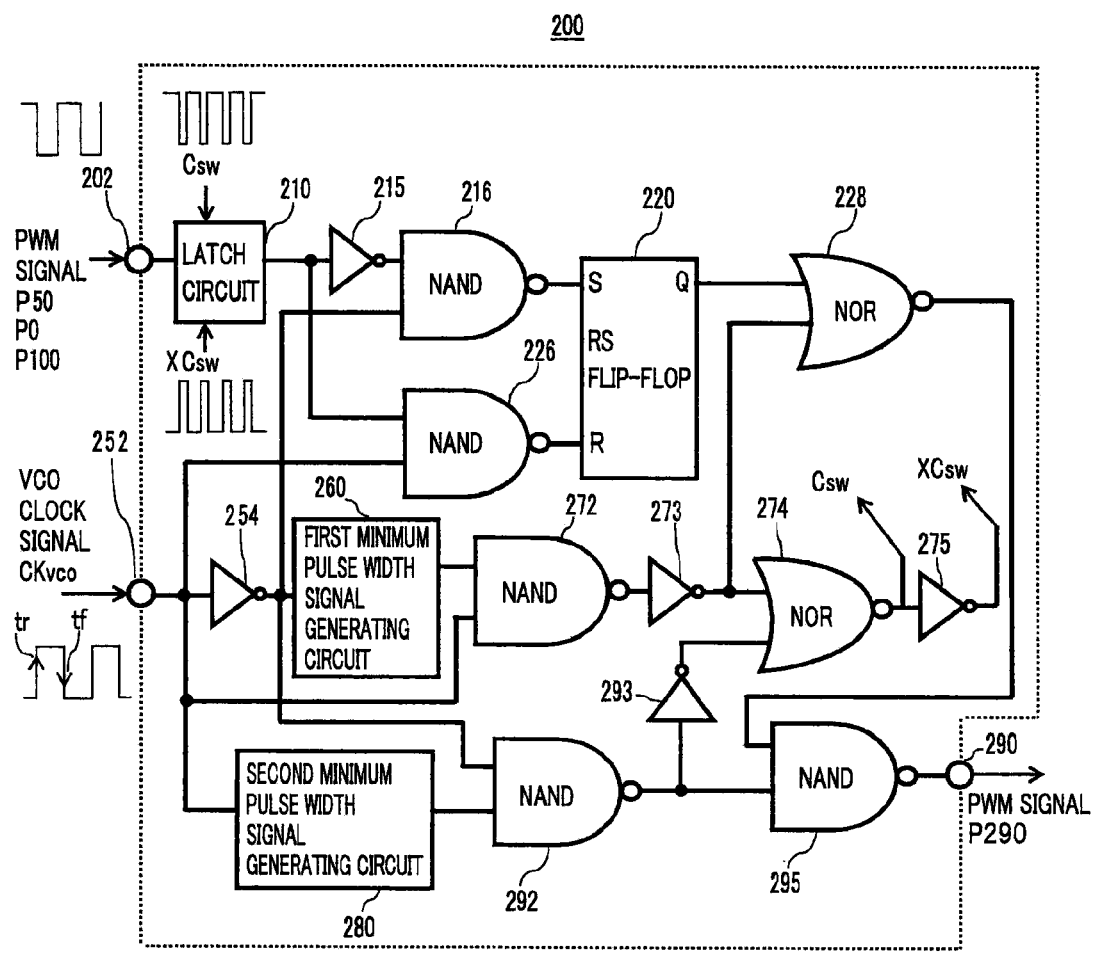
FIG. 4 is a circuit block diagram of a duty ratio adjusting circuit in the first embodiment of the present invention.

FIG. 4 shows a circuit block diagram of duty ratio adjusting circuit 200 according to the present invention. Duty ratio adjusting circuit 200 constitutes such a circuit configuration that receives the two types of signals different from each other in their signal components and outputs one signal. One of the two received signals is PWM signal P50 received at input terminal 202 and having a duty ratio of 0%-100%. PWM signal P50 encompasses any PWM signal signals having duty ratios that will or will not be adjusted. The other received signal is VCO clock signal CKvco received at VCO clock signal input terminal 252. The above-described one output signal is sent via output terminal 290. PWM signal P290, sent via output terminal 290, is a binarized signal obtained by providing pulse width modulation to the analog signal, but has a duty ratio adjusted from around 0% to for example approximately 3% or has a duty ratio adjusted from around 100% to for example approximately 97%. Further, a PWM signal P50 having a duty ratio falling within a range of for example 3%-97% is provided to output terminal 290 without the adjustment of duty ratio. Hence, for example, a PWM signal received at input terminal 202 and having a duty ratio of 50% is not subjected to the adjustment of duty ratio, and the PWM signal thus not adjusted is provided to output terminal 290. It should be noted that, as described above, PWM signals P50 having duty ratios of 0% and 100% are adjusted to have duty ratios of 3% and 97%, respectively.

PWM signal P50 received at input terminal 202 is sent to latch circuit 210. Latch circuit 210 has a circuit function of temporarily storing PWM signal P50 therein. The circuit operation of latch circuit 210 is controlled to be on/off by a first switch control signal Csw and a second switch control signal XCsw. Latch circuit 210 is configured to become on when, for example, first switch control signal Csw transitions from the low level to the high level, and become off at a timing at which first switch control signal Csw transitions from the high level to the low level. Latch circuit 210 may adopt a circuit type that employs a transfer gate, a circuit type in which NAND circuits or NOR circuits are cross-coupled, or the like. Latch circuits of these types are known to one having ordinary skills in the art. For example, latch circuit 210 can be constituted using one transfer gate constituted by a MOSFET, as well as a capacitor temporarily storing data (PWM signal) therein. Alternatively, the latch circuit can be constituted using two transfer gates and two inverters. In the first embodiment of the present invention, the latter latch circuit is adopted. The circuit operation thereof will be clearly described in detail below.

A latch output signal, extracted from latch circuit 210, is sent to an inverter 215, which then inverts the signal polarity thereof. The inverted signal of the latch output signal is then sent to a first input terminal of a NOT-AND (NAND) circuit 216. NOT-AND (NAND) circuit 216 has a second input terminal that receives a polarity-inverted signal of VCO clock signal CKvco having been received at an input terminal 252. The polarity of VCO clock signal CKvco has been inverted by inverter 254. For output of NOT-AND (NAND) circuit 216, there is extracted a logical product output of PWM signal P50 having been received at input terminal 202 and VCO clock signal CKvco having been received at input terminal 252. The logical product output signal thus extracted is sent to a set terminal S of an RS flip-flop 220. Each of NOT-AND (NAND) circuits 216, 226 may be constituted by an AND circuit and an inverter. Further, several inverters may be provided at stages before or after NOT-AND (NAND) circuits 216, 226.

The latch output signal extracted from latch circuit 210 is also sent to a first input terminal of NOT-AND (NAND) circuit 226, in addition to inverter 215. As such, the first input terminal of NOT-AND (NAND) circuit 226 receives the latch output signal not inverted, i.e., maintaining the same polarity. NOT-AND (NAND) circuit 226 has a second input terminal connected to input terminal 252, and therefore receives VCO clock signal CKvco not inverted, i.e., maintaining the same polarity. Accordingly, NOT-AND (NAND) circuit 226 outputs a negative logical product signal of the PWM signal received from latch circuit 210 and VCO clock signal CKvco. The signal thus output from NOT-AND (NAND) circuit 226 is sent to a reset terminal R of RS flip-flop 220.

As described above, the output signals of NOT-AND (NAND) circuits 216, 226 are respectively sent to set terminal S and reset terminal R of RS flip-flop 220. Thus, NOT-AND (NAND) circuits 216, 226 are provided to drive RS flip-flop 220. With such a circuit configuration, the PWM output signal from latch circuit 210 can be output from RS flip-flop 220 in synchronism with VCO clock signal CKvco.

VCO clock signal CKvco received at input terminal 252 has been generated by VCO 160 shown in FIG. 1 and is in synchronism with triangular wave signal Ps. It is obvious for one having ordinary skills in the art to generate triangular wave signal Ps based on VCO clock signal CKvco, or to perform waveform shaping reverse to this, i.e., to perform waveform shaping based on triangular wave signal Ps to generate VCO clock signal CKvco. In the case where VCO clock signal CKvco is generated based on triangular wave signal Ps prepared to be used by PWM circuit 150, the frequency of VCO clock signal CKvco is determined uniquely. The word "uniquely" herein indicates that the frequency of VCO clock signal CKvco cannot be set different from that of triangular wave signal Ps. The frequencies thereof are generally selected to fall within a range of several hundred KHz to several MHz. In the first embodiment of the present invention, when VCO clock signal CKvco has a frequency f=500 KHz, a cycle T1=2 μs and a duty ratio is 50%.

VCO clock signal CKvco received at input terminal 252 is sent to inverter 254. Inverter 254 inverts the polarity of VCO clock signal CKvco, and serves as a buffer for circuit connection with the next stage. It should be noted that duty ratio adjusting circuit 200 employs several inverters apart from inverter 254, and these inverters are provided for the above-described purpose and are also provided to delay signals by predetermined times. Inverter 254 sends its output signal to a first minimum pulse width signal generating circuit 260. It should be noted that inverter 254 may be constituted by a plurality of inverters connected in series, rather than a single inverter.

First minimum pulse width signal generating circuit 260 generates a signal having a minimum pulse width maintained at a predetermined adjustment ratio with respect to cycle T1 of VCO clock signal CKvco received at input terminal 252. The predetermined adjustment ratio is an order of several percent, and falls within a range of, for example, 0%-5%. The signal having a pulse width maintained at the predetermined adjustment ratio, the first minimum pulse width signal, is generated to adjust or control the duty ratio of the PWM signal. In the case where the predetermined adjustment ratio is set at for example 3%, a signal having a pulse width corresponding to 3% of the cycle of VCO clock signal CKvco is generated. For example, when the frequency of VCO clock signal CKvco is set at 500 KHz, cycle T1 thereof=2 μs. 3% of cycle T1 is: 2 μs×3%=60 ns. Hence, a signal having a pulse width of 60 ns is generated as the signal having a pulse width maintained at the predetermined adjustment ratio. The magnitude of the minimum pulse width determines an adjustment ratio for duty ratio. Here, assuming that the adjustment ratio for duty ratio is 3%, PWM signals P50 having duty ratios of 0%-3% and 97%-100% will be subjected to adjustment thereof. In other words, PWM signals P50 having duty ratios of 3%-97% will not be subjected to the adjustment.

The output signal of first minimum pulse width signal generating circuit 260 and VCO clock signal CKvco are respectively sent to the first input terminal and second input terminal of the NOT-AND (NAND) circuit 272. A logical negative product signal of these signals is output from an output terminal of NOT-AND (NAND) circuit 272. The output signal of NOT-AND (NAND) circuit 272 is sent to an inverter 273. Inverter 273 provides its output signal to a second input terminal of an NOT-OR (NOR) circuit 228. Further, the output signal of inverter 273 is also provided to a first input terminal of an NOT-OR (NOR) circuit 274.

VCO clock signal CKvco received at input terminal 252 is also sent to an input terminal of a second minimum pulse width signal generating circuit 280. Second minimum pulse width signal generating circuit 280 has substantially the same circuit configuration as that of first minimum pulse width signal generating circuit 260. They are different from each other in that second minimum pulse width signal generating circuit 280 directly receives VCO clock signal CKvco whereas first minimum pulse width signal generating circuit 260 receives it via inverter 254. First, second minimum pulse width signal generating circuits 260, 280 are configured so that when either one of them generates, in synchronism with a rising edge tr of VCO clock signal CKvco, a signal having a minimum pulse width, the other generates, in synchronism with a falling edge tf thereof, a signal having a minimum pulse width.

Each of first, second minimum pulse width signal generating circuits 260, 280 can be constituted by a combination of an integrating circuit made up of a resistor and a capacitor, and a Schmitt trigger circuit. Alternatively, a monostable multivibrator may be used to generate a signal having such a predetermined minimum pulse width.

The signal generated by second minimum pulse width signal generating circuit 280 and the signal obtained by inverting the polarity of VCO clock signal CKvco by inverter 254 are respectively input to first, second input terminals of a NOT-AND (NAND) circuit 292. With such a circuit configuration, NOT-AND (NAND) circuit 292 outputs a logical negative product signal of these signals. The signal thus output therefrom is substantially the same as the signal generated by second minimum pulse width signal generating circuit 280. The polarity of the output signal of NOT-AND (NAND) circuit 292 is inverted by inverter 293, and then is sent to the second input terminal of NOT-OR (NOR) circuit 274. Further, the output signal of NOT-AND (NAND) circuit 292 is also sent to a second input terminal of an NOT-AND (NAND) circuit 295.

NOT-OR (NOR) circuit 274 receives, at its first, second input terminals, the signals generated by first, second minimum pulse width signal generating circuits 260, 280 respectively, and outputs via its output terminal a signal in which these signals are combined. This signal serves as first switch control signal Csw for controlling on/off of latch circuit 210. Further, an inverter 275 inverts the polarity of first switch control signal Csw to generate second switch control signal XCsw. Thus, second switch control signal XCsw has a complementary relation with first switch control signal Csw in that the polarity thereof is opposite to that of first switch control signal Csw, and second switch control signal XCsw is used as a signal for controlling on/off of latch circuit 210, as with first switch control signal Csw. It is obvious for one having ordinary skills in the art that the circuit function of NOT-OR (NOR) circuit 274 can be provided by a combination of an OR circuit and an inverter.

Each of first, second switch control signals Csw, XCsw, thus prepared to control latch circuit 210, has only a signal component of the VCO clock signal CKvco having been input to input terminal 252, and has a pulse width set at an order of several percent of VCO clock signal CKvco. First, second switch control signals Csw, XCsw have pulse widths Wsw1, Wsw2, each of which determines the adjustment ratio for duty ratio in duty ratio adjusting circuit 200. It should be noted that pulse widths Wsw1, Wsw2 have been set by first, second minimum pulse width signal generating circuits 260, 280.

The Q output signal of RS flip-flop 220 is sent to the first input terminal of NOT-OR (NOR) circuit 228 whereas the signal generated by first minimum pulse width signal generating circuit 260 is sent to the second input terminal thereof via NOT-AND (NAND) circuit 272 and inverter 273. Accordingly, NOT-OR (NOR) circuit 228 outputs a logical sum signal of these signals. The Q output signal of RS flip-flop 220 is a signal obtained through logical processing of PWM signal P50 and VCO clock signal CKvco. On the other hand, the signal generated by first minimum pulse width signal generating circuit 260 only has the signal component of VCO clock signal CKvco. Hence, NOT-OR (NOR) circuit 228 outputs it at a timing at which PWM signal P50 is in synchronism with VCO clock signal CKvco.

The output signal of NOT-OR (NOR) circuit 228 and the output signal of NOT-AND (NAND) circuit 292 are respectively sent to the first, second input terminals of NOT-AND (NAND) circuit 295. As described above, the output signal of NOT-OR (NOR) circuit 228 is a signal obtained through logical processing of PWM signal P50 and VCO clock signal CKvco, i.e., a signal in which the two signals are reflected each other. On the other hand, the output signal of NOT-AND (NAND) circuit 292 only has the signal component of VCO clock signal CKvco, and includes no signal component of PWM signal P50. NOT-AND (NAND) circuit 295 provides logical product processing of PWM signal P50 and the signal generated by second minimum pulse width signal generating circuit 280, and supplies its output to output terminal 290. The first input terminal of NOT-AND (NAND) circuit 295 receives the output signal of NOT-OR (NOR) circuit 228. The output signal of NOT-OR (NOR) circuit 228 corresponds to an inverted signal of the signal generated by first minimum pulse width signal generating circuit 260. Hence, PWM signal P290 output via output terminal 290 is a signal in which the signal component of PWM signal P50 as well as the signal component of VCO clock signal CKvco are reflected. The signal component of VCO clock signal CKvco corresponds to the resulting signal provided by each of first, second minimum pulse width signal generating circuits 260, 280, and adjusted to have the minimum pulse width, i.e., adjusted to have the predetermined duty ratio. PWM signal P290 is supplied from output terminal 290 to first driver 170 and second driver 180 shown in FIG. 1.

Duty ratio adjusting circuit 200 shown in FIG. 4 is provided with the two minimum pulse width signal generating circuits, but may be provided with one minimum pulse width signal generating circuit. For example, second minimum pulse width signal generating circuit 280 may not be provided. In the case where second minimum pulse width signal generating circuit 280 is not provided, NOT-AND (NAND) circuit 292 may be adapted to receive an inverted signal of the signal generated by first minimum pulse width signal generating circuit 260 and an inverted signal of VCO clock signal CKvco. However, in the first embodiment of the present invention, the two minimum pulse width signal generating circuits are provided to ensure stable circuit operations.

Figure 5:
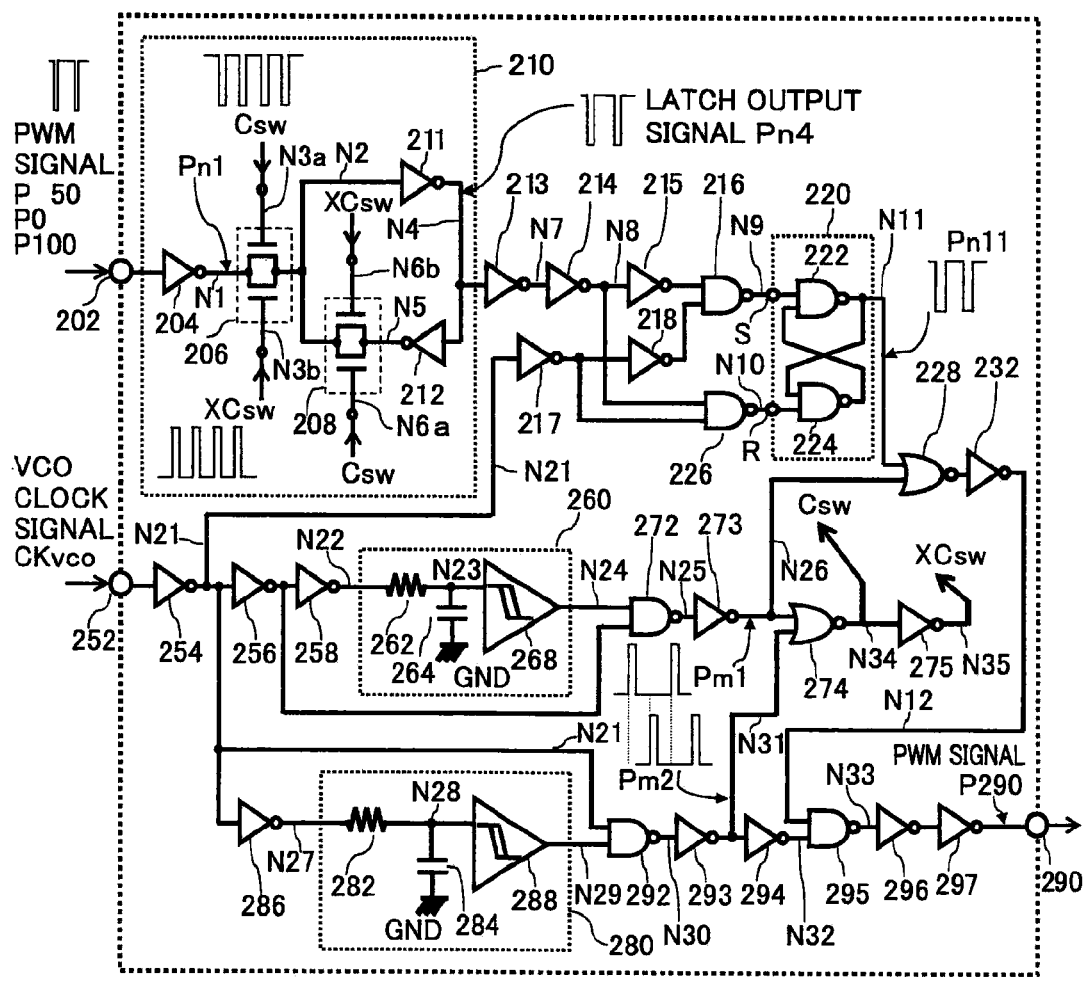
FIG. 5 is a specific circuit diagram of the duty ratio adjusting circuit shown in FIG. 4 in the first embodiment of the present invention.

FIG. 5 is a specific circuit diagram of duty ratio adjusting circuit 200 according to the present invention. In other words, FIG. 5 shows duty ratio adjusting circuit 200 shown in FIG. 4 more specifically. Duty ratio adjusting circuit 200 according to the present invention has latch circuit 210. Latch circuit 210 has an inverter 204 for inverting PWM signal P50 having been received at input terminal 202; a first transfer gate 206 receiving the output signal of inverter 204 and controlled to be on/off by first switch control signal Csw and second switch control signal XCsw; inverters 211, 212 connected in series to hold the output signal of first transfer gate 206; and a second transfer gate 208 receiving an output signal of inverter 212, having an output terminal connected to an input terminal of inverter 211, and controlled to be on/off by first and second switch control signals Csw, XCsw.

Input terminal 202 receives PWM signal P50 from PWM circuit 150 shown in FIG. 1. PWM signal P50 is a binarized signal having two levels of high and low and changing its pulse width with passage of time. PWM signal P50 has a duty ratio falling within a range of 0%-100%.

Connected to input terminal 202 is latch circuit 210. Inverter 204 inverts the polarity of PWM signal P50 having been received at input terminal 202, so as to obtain a PWM signal Pn1, which is then sent to first transfer gate 206. It should be noted that inverter 204 has a circuit function to also serve as a buffer between the preceding stage and the subsequent stage, i.e., between PWM circuit 150 and transfer gate 206. First transfer gate 206 has an input terminal, an output terminal, and control terminals, which respectively connected to a node N1, a node N2, and nodes N3a, N3b. Nodes N3a, N3b receive first switch control signal Csw and second switch control signal XCsw, respectively. The circuit operation of first transfer gate 206 is controlled to be on/off by first switch control signal Csw and second switch control signal XCsw. First switch control signal Csw and second switch control signal XCsw are in a complementary relation with each other in that their polarities are opposite to each other.

The circuit of first transfer gate 206 is configured so that, for example, it becomes on when first switch control signal Csw transitions from the low level to the high level. When first switch control signal Csw is at the high level, PWM signal P50 having been input to input terminal 202 is transmitted to a node N4 via nodes N1, N2, and is written in node N4. On this occasion, second transfer gate 208 is in the off state. As with first transfer gate 206, second transfer gate 208 has an input terminal, an output terminal, and control terminals, which are respectively connected to nodes N5, N2, and N6a, N6b. Second transfer gate 208 has such a circuit configuration that it becomes on when first switch control signal Csw transitions from the high level to the low level. Namely, second transfer gate 208 is in complementary relation with on/off of first transfer gate 206. Thus, when first transfer gate 206 is on, latch output signal Pn4 at node N4, i.e., at the output terminal of latch circuit 210 is never fed back to node N2.

First transfer gate 206 is turned off when first switch control signal Csw is brought into the low level. On this occasion, second transfer gate 208 is turned on, so latch output signal Pn4 having been written in node N4 is fed back to node N2 via node N5, thereby holding the PWM signal. In this way, latch circuit 210 determines from first switch control signal Csw and second switch control signal XCsw whether to transmit (write) or hold PWM signal P50.

The output terminal of latch circuit 210 is connected to a common connection point of inverter 211 and inverter 212, i.e., to node N4. The PWM signal latched by latch circuit 210 is output to node N4, and is then sent to the first input terminal of NOT-AND (NAND) circuit 216 via inverters 213, 214, and 215. Inverter 213 inverts latch output signal Pn4 having been sent to node N4, and has a function to serve as a buffer for getting the signal out of latch circuit 210. Inverter 213 has an output terminal connected to node N7. Inverters 214, 215 are connected in series, and have a common connection point, i.e., a node N8 connected to the second input terminal of NOT-AND (NAND) circuit 226.

NOT-AND (NAND) circuit 216 has a first input terminal that receives, via latch circuit 210 and inverters 213-215, PWM signal P50 having been input to input terminal 202. NOT-AND (NAND) circuit 216 has a second input terminal that receives, via inverters 254, 217, and 218, VCO clock signal CKvco having been input to input terminal 252. Specifically, the first input terminal of NOT-AND (NAND) circuit 216 receives a PWM signal having a polarity opposite to that of latch output signal Pn4 at node N4 corresponding to the output terminal of latch circuit 210, whereas the second input terminal thereof receives an inverted signal of VCO clock signal CKvco. In this way, from an output terminal of NOT-AND (NAND) circuit 216, i.e., a node N9, a logical product signal of PWM signal and VCO clock signal CKvco is output.

NOT-AND (NAND) circuit 226 is provided for substantially same purpose as that of NOT-AND (NAND) circuit 216, and has substantially the same circuit configuration. Specifically, NOT-AND (NAND) circuit 226 is also disposed to provide logical product processing of latch output signal Pn4 and VCO clock signal CKvco. These two NOT-AND (NAND) circuits are different in that the respective input signals provided to the input terminals thereof are opposite to each other in polarity. Specifically, the first input terminal of NOT-AND (NAND) circuit 226 receives a non-inverted signal having the same polarity as that of latch output signal Pn4 at node N4 corresponding to the output terminal of latch circuit 210, whereas the second input terminal thereof receives a non-inverted signal having the same polarity as that of VCO clock signal CKvco. As such, NOT-AND (NAND) circuit 216, 226 are provided for generation of the set pulse and reset pulse at the next stage, RS flip-flop 220. Further, NOT-AND (NAND) circuits 216, 226 are provided for logical processing of latch output signal Pn4 and VCO clock signal CKvco. Hence, each of NOT-AND (NAND) circuits 216, 226 performs predetermined logical processing of these signals and then provides a resulting output to each of nodes N9, N10.

Node N9 and node N10 are connected to set terminal S and reset terminal R of RS flip-flop 220. RS flip-flop 220 operates in synchronism with falling edges of the signals having been output to node N9 and node N10. RS flip-flop 220 outputs, to node N11, a PWM signal Pn11 substantially the same as latch output signal Pn4 having been output to node N4.

PWM signal Pn11 from RS flip-flop 220 to node N11 is then sent to the first input terminal of an OR circuit 228. OR circuit 228 has an output terminal connected to an input terminal of an inverter 232. Inverter 232 has an output terminal connected to a node N12. Now, explanation for the flow of signal from node N11 to output terminal 290 is temporarily stopped. The following describes a signal path for VCO clock signal CKvco input to input terminal 252.

VCO clock signal CKvco received at input terminal 252 is sent to inverter 254. Inverter 254 inverts the polarity of the VCO clock signal, and also has a circuit function to serve as a buffer for circuit connection with the next stage. Inverter 254 has its output terminal connected to a node N21. An output signal of inverter 254 is sent to first minimum pulse width signal generating circuit 260 via inverters 256, 258. Node N21 is connected to inverters 217, 218 connected in series, and an output signal of inverter 218 is sent to the second input terminal of NOT-AND (NAND) circuit 216.

First minimum pulse width signal generating circuit 260 has its input terminal connected to a node N22. Node N22 is connected to an integrating circuit constituted by a resistor 262 and a capacitor 264. The integrating circuit is provided so that a predetermined signal having the first minimum pulse width will be generated by the next stage, i.e., a Schmitt trigger circuit 268. Namely, the integrating circuit constituted by resistor 262 and capacitor 264 generates a triangular wave or sawtooth wave signal set to rise and fall at predetermined times. From the integration signal generated by resistor 262 and capacitor 264, Schmitt trigger circuit 268, connected between a node N23 and a node N24, generates a rectangular wave signal having a predetermined pulse width. Here, the rectangular wave signal set to have the predetermined pulse width is defined as "first minimum width pulse" in the present specification, and the circuit portion for generating this signal is defined as "first minimum pulse width signal generating circuit". The second minimum width pulse generated by first minimum pulse width signal generating circuit 260 and second minimum pulse width signal generating circuit 280 described below determines uniquely the adjustment ratio for duty ratio in duty ratio adjusting circuit 200 of the present invention. In the first embodiment of the present invention, first minimum pulse width signal generating circuit 260 is constituted by the combination of the integrating circuit and the Schmitt circuit, but a monostable multivibrator may be employed to generate a signal having such a predetermined pulse width.

Node N24 is connected to a first input terminal of a NOT-AND (NAND) circuit 272. Since node N24 is connected to the output terminal of Schmitt circuit 268, the first minimum width pulse generated by first minimum pulse width signal generating circuit 260 and having a relatively small pulse width exists therein. The first minimum width pulse thus existing in node N24 has a pulse width proportional to cycle T1 of VCO clock signal CKvco, but generally has a pulse width of several ten ns to several hundred ns, and has the same frequency as that of VCO clock signal CKvco. NOT-AND (NAND) circuit 272 has its second input terminal connected to the common connection point of inverter 256 and inverter 258. The signal at the common connection point thereof is substantially the same as VCO clock signal CKvco. NOT-AND (NAND) circuit 272 has its output terminal connected to a node N25. Node N25 receives a logical product signal of the output signal of first minimum pulse width signal generating circuit 260 and VCO clock signal CKvco. The output signal of NOT-AND (NAND) circuit 272 is then input to inverter 273 and inverter 273 has its output terminal connected to a node N26. The signal at node N26 is substantially the same as the output signal of first minimum pulse width signal generating circuit 260. The signal at node N26 is sent to the first input terminal of NOT-OR (NOR) circuit 274.

Second minimum pulse width signal generating circuit 280 has its input terminal connected to a node N27. Between input terminal 252 and node N27, inverters 254, 286 connected in series are connected. Thus, the input terminal of second minimum pulse width signal generating circuit 280, i.e., node N27 receives a signal substantially the same as VCO clock signal CKvco. Node N27 is connected to an integrating circuit constituted by a resistor 282 and a capacitor 284. This integrating circuit is provided so that the next stage, a Schmitt trigger circuit 288, will generate a predetermined signal having the second minimum pulse width. Specifically, the integrating circuit constituted by resistor 282 and capacitor 284 generates a triangular wave or sawtooth wave signal set to rise and fall at predetermined times. Namely, by setting a CR time constant of resistor 282 and capacitor 284, a signal having the predetermined pulse width is generated. Schmitt trigger circuit 288 has its input terminal connected to a node N28. Schmitt trigger circuit 288 has its output terminal connected to a node N29. The signal generated by second minimum pulse width signal generating circuit 280 uniquely determines the adjustment ratio for duty ratio in duty ratio adjusting circuit 200. In the first embodiment of the present invention, second minimum pulse width signal generating circuit 280 is constituted by the combination of the integrating circuit and the Schmitt circuit, but a monostable multivibrator may be employed to generate a signal having such a predetermined pulse width.

Node N29 is connected to the second input terminal of NOT-AND (NAND) circuit 292. Since node N29 is connected to the output terminal of Schmitt circuit 288, the signal generated by second minimum pulse width signal generating circuit 280 and having a relatively small pulse width exists therein. The signal thus existing in node N29 has a pulse width proportional to cycle T1 of VCO clock signal CKvco, but generally has a pulse width of several ten ns to several hundred ns and has the same frequency as that of VCO clock signal CKvco. NOT-AND (NAND) circuit 292 has its first input terminal connected to a common connection point of inverter 254 and inverter 256. The common connection point thereof is connected to node N21, and the signal at node N21 is substantially the same as an inverted signal of VCO clock signal CKvco.

NOT-AND (NAND) circuit 292 has its output terminal connected to a node N30. Node N30 receives a logical product signal of the output signal of second minimum pulse width signal generating circuit 280 and VCO clock signal CKvco. The output signal of NOT-AND (NAND) circuit 292 is sent to inverter 293, and inverter 293 has its output terminal connected to an input terminal of an inverter 294 and a node N31. The signal at node N31 is substantially the same as the output signal of second minimum pulse width signal generating circuit 280.

A NOT-AND (NAND) circuit 295 has its first input terminal connected to node N12, and has its second input terminal connected to a node N32. Since node N32 receives the signal from NOT-AND (NAND) circuit 292, the signal at node N32 is a signal having a polarity inverted by inverters 293, 294, and is therefore substantially the same as the signal at node N30.

NOT-AND (NAND) circuit 295 has its output terminal connected to a node N33. The signal at node N33 is led to output terminal 290 via inverters 296, 297.

The first input terminal of NOT-OR (NOR) circuit 274, i.e., node N26 is provided with the signal generated by first minimum pulse width signal generating circuit 260. The second input terminal thereof, i.e., node N31 is provided with the signal generated by second minimum pulse width signal generating circuit 280. With such a circuit configuration, the two signals generated by both the minimum pulse width signal generating circuits are combined to provide first switch control signal Csw to node N34 to which the output terminal of NOT-OR (NOR) circuit 274 is connected. Inverter 275 inverts the polarity of first switch control signal Csw to provide second switch control signal XCsw. First switch control signal Csw is then applied as a first switch control signal to first, second transfer gates 206, 208. Inverter 275 has its output terminal connected to node N35. Second switch control signal XCsw at node N35 is supplied to nodes N3$b$, N6$b$ of latch circuit 210, whereas first switch control signal Csw at node N34 is supplied to nodes N3$a$, N6$a$.

Here, the following describes the flow of signal to output terminal 290 from node N11 connected to the output terminal of the RS flip-flop 220.

NOT-OR (NOR) circuit 228 has its first input terminal connected to node N11. To node N11, the output signal of RS flip-flop 220 is extracted. PWM signal Pn11 thus extracted to node N11 is substantially the same as latch output signal Pn4 at the output terminal of latch circuit 210, i.e., node N4. Latch output signal Pn4 is written in accordance with first, second switch control signals Csw, XCsw having adjusted pulse widths, i.e., having adjusted duty ratios, so a PWM signal having an adjusted duty ratio is obtained at node N11.

NOT-OR (NOR) circuit 228 has its second input terminal connected to node N26. The first and second input terminals of NOT-OR (NOR) circuit 228 receive the output signal of RS flip-flop 220 and the signal generated by first minimum pulse width signal generating circuit 260, respectively. Accordingly, a logical negative product signal of these signals is output via the output terminal of NOT-OR (NOR) circuit 228. The output signal of RS flip-flop 220 is a signal obtained by logical processing of latch output signal Pn4 and VCO clock signal CKvco. On the other hand, the signal generated by minimum pulse width signal generating circuit 260 only has a signal component of VCO clock signal CKvco. Hence, latch output signal Pn4 is output from NOT-OR (NOR) circuit 228 in synchronism with VCO clock signal CKvco.

The output signal of NOT-OR (NOR) circuit 228 is sent to the first input terminal of NOT-AND (NAND) circuit 295 via inverter 232. The output terminal of inverter 232 is connected to node N12. The first input terminal and second input terminal of NOT-AND (NAND) circuit 295 receive the output signal of NOT-OR (NOR) circuit 228 and the output signal of NOT-AND (NAND) circuit 292, respectively. The first input terminal, second input terminal, and output terminal of NOT-AND (NAND) circuit 295 are connected to node N12, node N32, and node N33, respectively. As described above, the output signal of NOT-OR (NOR) circuit 228 is a signal obtained by logical processing of PWM signal P50 and VCO clock signal CKvco. On the other hand, the output signal of NOT-AND (NAND) circuit 292 only has a signal component of VCO clock signal CKvco, and no signal component of PWM signal P50 is not reflected therein. NOT-AND (NAND) circuit 295 performs logical product processing of PWM signal P50 and the signal generated by second minimum pulse width signal generating circuit 280, and provides its resulting output to output terminal 290 via inverters 296, 297. It should be noted that the first input terminal of NOT-AND (NAND) circuit 295 receives the output signal of first NOT-OR (NOR) circuit 228 and the signal generated by first minimum pulse width signal generating circuit 260 is reflected in the first output thereof, so PWM signal P290 sent to output terminal 290 is a signal in which the signal component of PWM signal P50 and the signal component of VCO clock signal CKvco are reflected. The signal component of VCO clock signal CKvco corresponds to the resulting signal provided by each of first, second minimum pulse width signal generating circuits 260, 280, and adjusted to have the minimum pulse width, i.e., adjusted to have the predetermined duty ratio. PWM signal P290 from output terminal 290 is supplied to first driver 170 and second driver 180 shown in FIG. 1. PWM signal 290 from output terminal 290 is substantially equivalent to latch output signal Pn4 at the output terminal of latch circuit 210, i.e., node N4.

Duty ratio adjusting circuit 200 employs NOT-AND (NAND) circuits 216, 226, 272, 292, 295 and NOT-OR (NOR) circuits 228, 274. This is, however, just one embodiment and the present invention is not limited to this. For example, a NOT-AND (NAND) circuit may be constituted by a combination of an AND circuit and an inverter. Likewise, a NOT-OR (NOR) circuit may be constituted by a combination of an OR circuit and an inverter. Assuming that AND circuits, NOT-AND (NAND) circuits, OR circuits, and NOT-OR (NOR) circuits are collectively defined as "logical circuits", one having ordinary skills in the art can relatively readily implement the technical idea disclosed in the present invention by means of combinations of these logical circuits.

Figure 6A:
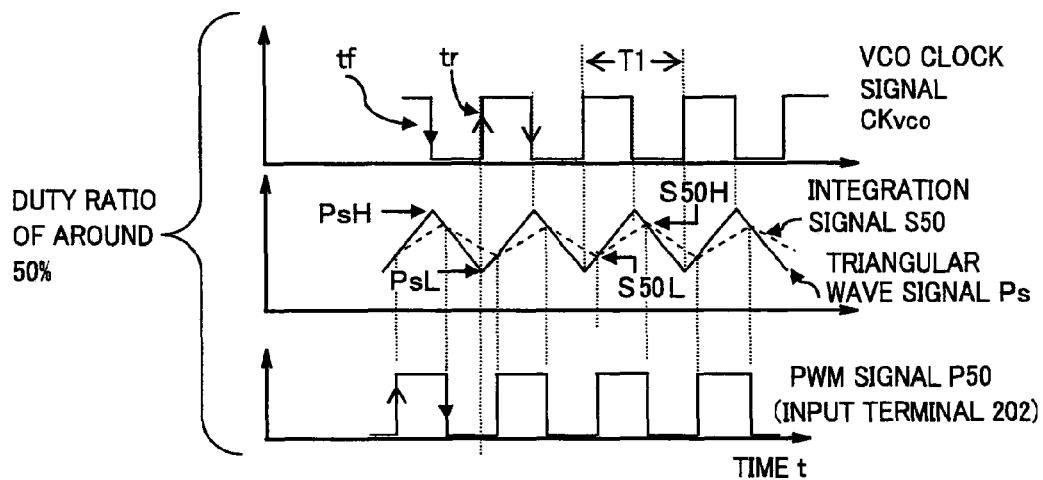
FIG. 6A illustrates circuit operations of a modulation circuit employed in the class D power amplifier of the present invention, when a duty ratio is around 50%.

FIG. 6A shows waveforms of signals in PWM circuit 150 and its adjacent circuit portion when the PWM signal has a duty ratio of around 50%. FIG. 6A has an upper portion indicating VCO clock signal CKvco, which is a rectangular wave signal generated by VCO 160 of FIG. 1. VCO clock signal CKvco has a rising edge tr and a falling edge tf, and a cycle thereof is indicated by a reference character T1.

FIG. 6A has an middle portion showing a state in which triangular wave signal Ps has a minimum value PsL and a maximum value PsH in synchronism with rising edge tr and falling edge tf of VCO clock signal CKvco. The middle portion thereof also shows integration signal S50. Triangular wave signal Ps is generated by VCO 160, as with VCO clock signal CKvco. Integration signal S50 is the signal sent from integrating circuit 140 shown in FIG. 1 to PWM circuit 150. The respective levels of integration signal S50 and triangular wave signal Ps are compared with each other by the comparator provided in PWM circuit 150. FIG. 6A has a lower portion showing PWM signal P202 sent from the output terminal of PWM circuit 150 to input terminal 202. PWM signal P202 is generated at a timing at which integration signal S50 and triangular wave signal Ps come across, and is therefore output with such a polarity that it becomes a high level when triangular wave signal Ps is at a level higher than that of integration signal S50 and becomes a low level when triangular wave signal Ps is at a level lower than that of integration signal S50, for example.

Figure 6B:
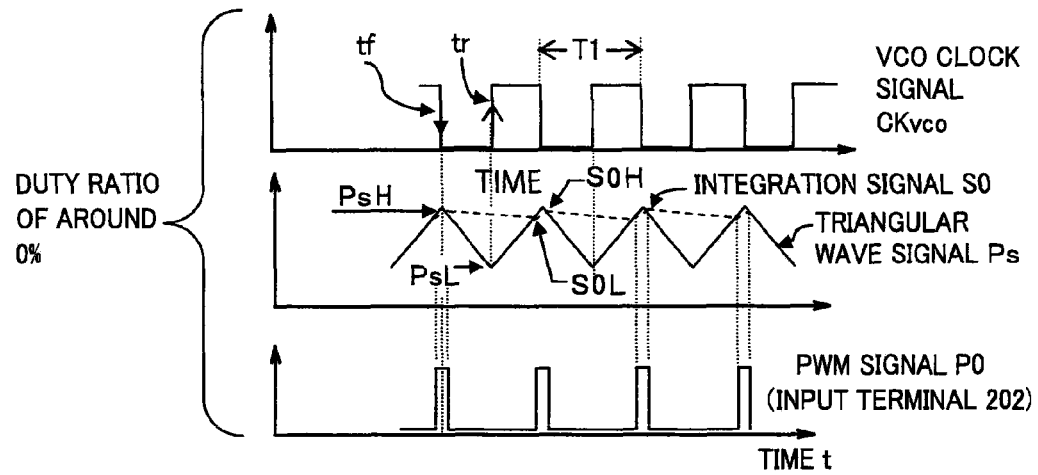
FIG. 6B illustrates circuit operations of the modulation circuit employed in the class D power amplifier of the present invention, when the duty ratio is around 0%.

FIG. 6B shows waveforms of the signals in PWM circuit 150 and its adjacent circuit portion when the PWM signal has a duty ratio of around 0%. FIG. 6B has an upper portion showing VCO clock signal CKvco, which is a rectangular wave signal generated by VCO 160 of FIG. 1. VCO clock signal CKvco therein is the same as that shown in the upper portion of FIG. 6A. FIG. 6B has a middle portion showing a state in which triangular wave signal Ps has maximum value PsH and minimum value PsL in synchronism with rising edge tr and falling edge tf of VCO clock signal CKvco. The middle portion thereof also shows integration signal S0. Triangular wave signal Ps is generated by VCO 160 as with VCO clock signal CKvco. Integration signal S0 is the signal sent from integrating circuit 140 shown in FIG. 1 to PWM circuit 150. The respective levels of integration signal S0 and triangular wave signal Ps are compared with each other by the comparator provided in PWM circuit 150. FIG. 6B has a lower portion showing PWM signal P202 sent from the output terminal of PWM circuit 150 to input terminal 202. PWM signal P202 thus sent therefrom has such a polarity that it becomes a high level when triangular wave signal Ps is at a level higher than that of integration signal S0 and becomes a low level at a level lower than that of integration signal S0.

As shown in the middle portion of FIG. 6B, when PWM signal P0 has a duty ratio of around 0%, maximum value S0H of integration signal S0 and maximum value PsH of triangular wave signal Ps are very close to each other in level and a differential voltage therebetween is very small. As the differential voltage is smaller, the circuit function of the comparator provided in PWM circuit 150 is decreased. Specifically, it was found that a boundary for the on/off operation of the comparator becomes less apparent and the PWM signal is therefore not output periodically, whereby popping noise is likely to be generated.

FIG. 6B has a lower portion schematically showing PWM signal P0 having a duty ratio of around 0% and sent from the output terminal of PWM circuit 150 to input terminal 202. PWM signal P0 is generated at a timing at which integration signal S0 and triangular wave signal Ps come across, so triangular wave signal Ps is output with such a signal polarity that it becomes high level at a level higher than that of integration signal S0 and becomes low level at a level lower than integration signal S0, for example.

Figure 6C:
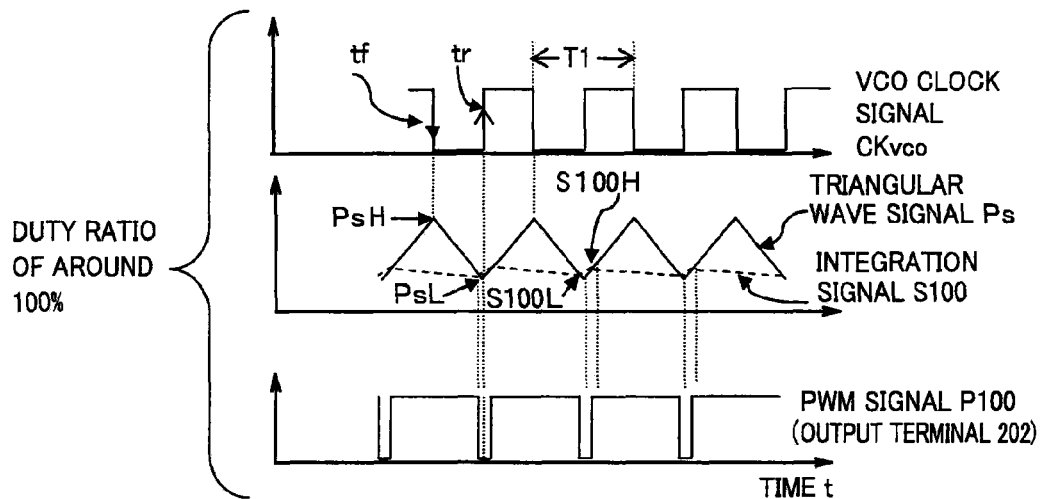
FIG. 6C illustrates circuit operations of the modulation circuit employed in the class D power amplifier of the present invention, when the duty ratio is around 100%.

FIG. 6C shows waveforms of signals in PWM circuit 150 and its adjacent circuit portion when the PWM signal has a duty ratio of around 100%. FIG. 6C has an upper portion showing VCO clock signal CKvco, which is a rectangular wave signal generated by VCO 160 of FIG. 1. VCO clock signal CKvco shown therein is exactly the same as VCO clock signal CKvco shown in each of the upper portions of FIG. 6A and FIG. 6B. FIG. 6C has a middle portion showing a state in which triangular wave signal Ps has maximum value PsH and minimum value PsL in synchronism with rising edge tr and falling edge tf of VCO clock signal CKvco. The middle portion thereof also shows integration signal S100. Triangular wave signal Ps is generated by VCO 160 as with VCO clock signal CKvco. Integration signal S100 is sent from integrating circuit 140 shown in FIG. 1 to PWM circuit 150. The respective levels of integration signal S100 and triangular wave signal Ps are compared by the comparator provided in PWM circuit 150. FIG. 6B has a lower portion showing PWM signal P202 sent from the output terminal of PWM circuit 150 to input terminal 202. PWM signal P202 is output with such a polarity that it becomes a high level when triangular wave signal Ps is a level higher than that of integration signal S50 and becomes a low level at a level lower than the level thereof.

As shown in the middle portion of FIG. 6C, when the PWM signal has a duty ratio of around 100%, minimum value S100L of integration signal S100 and minimum value PsL of triangular wave signal Ps are very close to each other in level, and a differential voltage therebetween is very small. As the differential voltage is smaller, the circuit function of the comparator provided in PWM circuit 150 may be disadvantageously decreased. This disadvantageous decrease takes place in a manner similar to the case where the duty ratio thereof is 0%.

FIG. 6C has a lower portion schematically showing PWM signal P202 having a duty ratio of around 100% and sent from the output terminal of PWM circuit 150 to input terminal 202.

Figure 7:
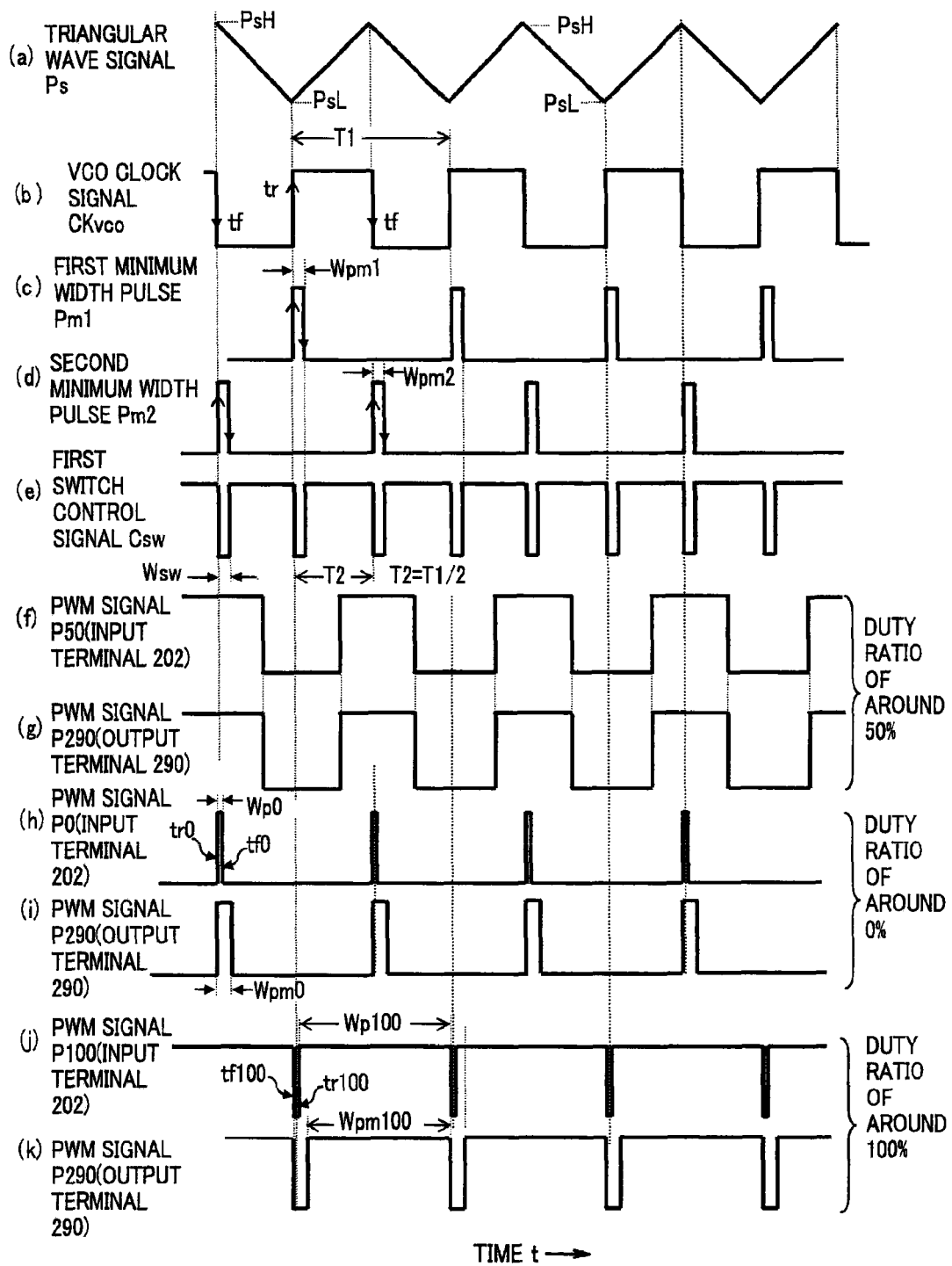
FIG. 7 illustrates a basic concept of adjusting the duty ratio by the duty ratio adjusting circuit shown in FIGS. 4, 5 in the first embodiment of the present invention.

FIG. 7 illustrates a basic concept of circuit operations of duty ratio adjusting circuit 200 shown in FIGS. 4, 5. Specifically, FIG. 7 illustrates timings of the PWM signals sent to/from input terminal 202 and output terminal 290 as well as the waveforms of the signals in cases where the duty ratios thereof are around 50%, 0%, and 100% respectively.

FIG. 7(a) shows triangular wave signal Ps, which is the same as triangular wave signal Ps shown in each of the middle portions of FIGS. 6A-6C. Specifically, triangular wave signal Ps is generated by VCO 160 shown in FIG. 1, and has an amplitude with maximum value PsH and minimum value PsL.

FIG. 7(b) shows VCO clock signal CKvco, which is the same as VCO clock signal CKvco shown in each of the upper portions of FIGS. 6A-6C and has rising edge tr, falling edge tf, and cycle T1. VCO clock signal CKvco is also generated by VCO 160, as with triangular wave signal Ps. VCO clock signal CKvco has a frequency set to fall within a range of several hundred KHz to several MHz. In the first embodiment, VCO clock signal CKvco has a frequency of 500 KHz, for example. When the frequency thereof is for example 500 KHz, cycle T1 thereof is 2 µs.

FIG. 7(c) shows first minimum width pulse Pm1. First minimum width pulse Pm1 is extracted to node N26 of duty ratio adjusting circuit 200 shown in FIG. 5, and is in synchronism with rising edge tr of VCO clock signal CKvco and minimum value PsL of triangular wave signal Ps, and has a pulse width Wpm1 set at a predetermined adjustment ratio relative to VCO clock signal CKvco. The predetermined adjustment ratio herein refers to a range of for example 0%-5% of cycle T1 of VCO clock signal CKvco, more preferably 3% of cycle T1. Assuming that cycle T1 of VCO clock signal CKvco is 2 µs and the adjustment ratio for the pulse width is 3%, Wpm1=2 µs×0.03=60 ns. In the present invention, first minimum width pulse Pm1 determines the adjustment ratio for duty ratio uniquely, as with second minimum width pulse Pm2 described below. The word "uniquely" herein means that in the first embodiment of the present invention, when each of first, second minimum width pulses Pm1, Pm2 is set to a predetermined magnitude, the adjustment ratio for duty ratio is accordingly determined based on the magnitude. In other words, the adjustment of duty ratio is determined by first, second minimum width pulses Pm1, Pm2, rather than other circuit portions. It should be noted that first minimum width pulse Pm1 is extracted from node N26 in the end, but is initially generated by first minimum width signal generating circuit 260.

FIG. 7(d) shows second minimum width pulse Pm2. Second minimum width pulse Pm2 is extracted to node N31 of duty ratio adjusting circuit 200 shown in FIG. 5, is in synchronism with falling edge tf of VCO clock signal CKvco and maximum value PsH of triangular wave signal Ps, and has pulse width Wpm2 set at a predetermined adjustment ratio relative to VCO clock signal CKvco. The predetermined adjustment ratio herein is the same as that applied to first minimum width pulse Pm1. Specifically, the predetermined adjustment ratio falls within a range of for example 0%-5% of cycle T1 of VCO clock signal CKvco, more preferably 3% of cycle T1. Assuming that cycle T1 of VCO clock signal CKvco is 2 µs and the adjustment ratio of pulse width is 3%, Wpm2=2 µs×0.03=60 ns. In the present invention, pulse width Wpm2 of second minimum width pulse Pm2 uniquely determines the adjustment ratio for duty ratio, as with pulse width Wpm1 of first minimum width pulse Pm1. Second minimum width pulse Pm2 is extracted from node N31 in the end, but is initially generated by second minimum width signal generating circuit 280. Normally, the circuit for generating second minimum width pulse Pmt is substantially the same as the one for generating first minimum width pulse Pm1, so the following relation is satisfied among these pulse widths: Wpm2=Wpm1=Wpm.

FIG. 7(e) shows first switch control signal Csw. First switch control signal Csw is extracted to node N34 of duty ratio adjusting circuit 200 shown in FIG. 5. Node N34 is connected to the output terminal of NOT-OR (NOR) circuit 274. NOT-OR (NOR) circuit 274 has its two input terminals respectively connected to nodes N26, N31, which respectively receive first, second minimum width pulses Pm1, Pm2 shown in FIGS. 7(c), (d). Hence, the signal obtained through NOT-OR (NOR) processing of these two pulses is led to node N34. Thus, first switch control signal Csw led to node N34 is the same as a signal having a waveform opposite to the waveform of a signal obtained by combining those shown in FIGS. 7(c), (d), and therefore has a waveform shown in FIG. 7(e). Further, pulse width Wsw of first switch control signal Csw is substantially equal to Wpm. In other words, there is satisfied a relation of Wsw=Wpm=Wpm1=Wpm2. It should be noted that first switch control signal Csw has a cycle T2, which is the half of cycle T1 of VCO clock signal CKvco, i.e., T2=T1/2.

First switch control signal Csw is sent to nodes N3a, N6a, which are the control terminals of transfer gates 206, 208. It should be noted that second switch control signal XCsw is sent to control terminals N3b, N6b of transfer gates 206, 208. It should be appreciated that second switch control signal XCsw is not shown in FIG. 7 because second switch control signal XCsw is a polarity-inverted signal of first switch control signal Csw.

FIG. 7(f) schematically shows PWM signal P50 received at input terminal 202 and having a duty ratio of around 50%. When the duty ratio thereof is 50%, PWM signal P50 has substantially the same waveform as that of VCO clock signal CKvco shown in FIG. 7(b).

FIG. 7(g) shows PWM signal P290 to be sent to output terminal 290 when PWM signal P50 having a duty ratio of around 50% is received at input terminal 202. Specifically, PWM signal P290 to be sent to output terminal 290 is the final PWM signal having been through the signal processing in duty ratio adjusting circuit 200, but when PWM signal P50 having a duty ratio of around 50% is received, PWM signal P290 to be output is substantially the same as PWM signal P50 received at input terminal 202.

FIG. 7(h) schematically shows PWM signal P0 received at input terminal 202 and having a duty ratio of around 0%. When the duty ratio thereof is around 0%, PWM signal P0 appears at timings of maximum value PsH of triangular wave signal Ps shown in FIG. 7(a) and falling edge tf of VCO clock signal CKvco shown in FIG. 7(b). In this state, rising edge tr0 and falling edge tf0 thereof are very close to each other.

FIG. 7(i) schematically shows PWM signal P290 to be sent to output terminal 290 when PWM signal P0 having a duty ratio of around 0% is received at input terminal 202. It can be seen that PWM signal P290 shown in FIG. 7(i) has pulse width Wpm0 wider than pulse width Wp0 of the one shown in FIG. 7(h). Specifically, pulse width Wpm0 is widened as large as pulse width Wpm2 of second minimum width pulse Pm2 shown in FIG. 7(d). To be accurate, pulse width Wpm0 of PWM signal P290 is slightly larger than pulse width Wpm2 of second minimum width pulse Pm2 because it is wider by the half of pulse width Wp0 of PWM signal P0. It should be noted that how large the pulse width is widened also depends on performances of PWM circuit 150 and duty ratio adjusting circuit 200. In consideration of difference in pulse width to be widened, the range of adjustment of duty ratio may be determined.

FIG. 7(j) schematically shows PWM signal P100 received at input terminal 202 and having a duty ratio of around 100%. When the duty ratio thereof is around 100%, PWM signal P100 appears at timings synchronized with minimum value PsL of triangular wave signal Ps shown in FIG. 7(a) and rising edge tr of VCO clock signal CKvco shown in FIG. 7(b). In this state, rising edge tf100 and falling edge tf100 thereof are close to each other. This state is substantially the same as that in the case where the duty ratio thereof is around 0% as shown in FIG. 7(h).

FIG. 7(k) schematically shows PWM signal P290 to be sent to output terminal 290 when PWM signal P100 having a duty ratio of around 100% is received at input terminal 202. PWM signal P290 shown in FIG. 7(k) is different from the one shown in FIG. 7(j), and has a pulse width Wpm100 smaller than pulse width Wp100. This indicates that the duty ratio of PWM signal P100 input to input terminal 202 has been reduced before being sent from output terminal 290. A difference in pulse width therebetween, (Wp100-Wpm100), is substantially equal to pulse width Wpm1 of first minimum width pulse Pm1 shown in FIG. 7(c). The difference in pulse width therebetween, (Wp100-Wpm100), corresponds to how large the duty ratio thereof is adjusted.

Figure 8:
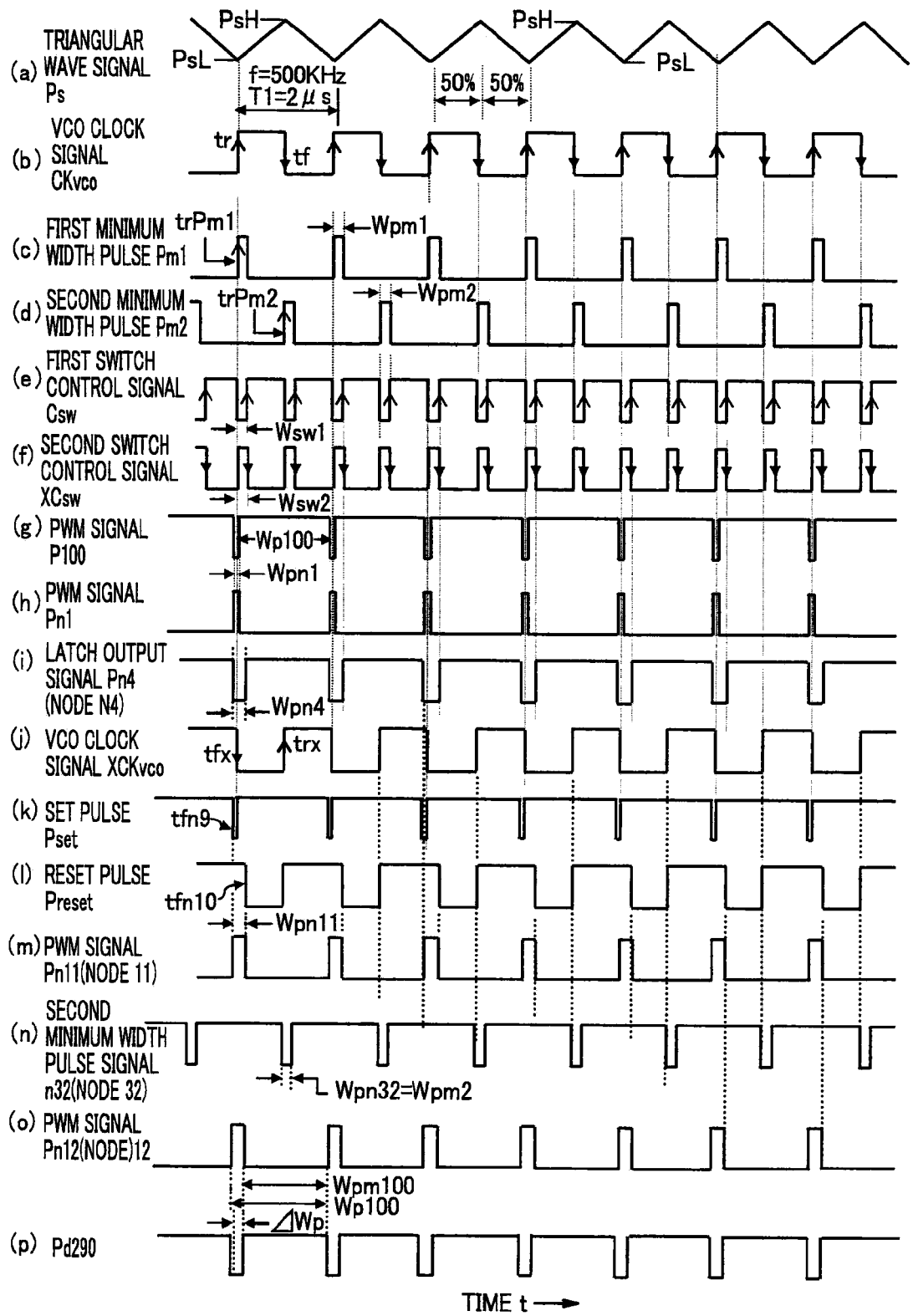
FIG. 8 is a timing chart for main portions of the duty ratio adjusting circuit shown in FIG. 5 in the first embodiment of the present invention.

FIG. 8 shows a timing chart in duty ratio adjusting circuit 200 shown in FIG. 5. Some of the signals at the respective nodes in FIG. 8 are also shown in FIG. 7. FIG. 7 deals with the cases where the duty ratio is around 50%, 0%, and 100%, so as to illustrate the basic concept of the circuit operations for adjusting the duty ratio. FIG. 8 only deal with the case where the duty ratio is around 100%, but it is considered that in view of the foregoing description made with respect to FIG. 7, one having ordinary skills in the art can readily figure out circuit operations in the case where the duty ratio is around 50% or 0%. It should be noted that duty ratio adjusting circuit 200 is supplied with a power source voltage of for example 5V. Accordingly, the amplitude values of the various signals, the rectangular wave signal, and the various pulse signals are substantially 5V, apart from triangular wave signal Ps.

FIG. 8(a) shows triangular wave signal Ps, which is generated by VCO 160 shown in FIG. 1. Triangular wave signal Ps has a frequency selected to generally fall within a range of several hundred KHz to several MHz, in the case of the separately-excited oscillation type PWM method. In the first embodiment of the present invention, the frequency thereof is 500 KHz. A difference in amplitude between maximum value PsH and minimum value PsL of triangular wave signal Ps, i.e., the amplitude value of triangular wave signal Ps is selected to be for example approximately 3 V.

FIG. 8(b) shows VCO clock signal CKvco. VCO clock signal CKvco is generated by VCO 160 as with triangular wave signal Ps. VCO clock signal CKvco serves as a reference signal based on which the various signals are generated in duty ratio adjusting circuit 200, and is sent to the respective logical circuits. VCO clock signal CKvco has a frequency as large as that of triangular wave signal Ps. For example, it has a frequency f=500 KHz and a cycle T1=2 μs. Rising edge tr and falling edge tf of VCO clock signal CKvco are respectively in synchronism with minimum value PsL and maximum value PsH of triangular wave signal Ps shown in FIG. 8(a).

FIG. 8(c) shows first minimum width pulse Pm1. First minimum width pulse Pm1 is generated based on VCO clock signal CKvco by first minimum pulse width signal generating circuit 260 shown in FIGS. 4, 5. Rising edge trPm1 of first minimum width pulse Pm1 is in synchronism with rising edge tr of VCO clock signal CKvco and minimum value PsL of triangular wave signal Ps.

The one with a duty ratio of around 100% is in association with rising edge tr of VCO clock signal CKvco, as described with respect to FIG. 7(j). Hence, by generating first minimum width pulse Pm1 in synchronism with rising edge tr of VCO clock signal CKvco, the PWM signal having a duty ratio of around 100% can be controlled and adjusted. First minimum width pulse Pm1 is generated as follows. VCO clock signal CKvco is shaped in waveform into for example a triangular wave signal by means of resistor 262 and capacitor 264 shown in FIG. 5, and the signal thus shaped is thereafter used for generation thereof in the next stage, Schmitt trigger circuit 268. First minimum pulse width Wpm1 is specifically several percent of cycle T1 of VCO clock signal CKvco, is preferably 0%-5%, and is more preferably 3% thereof. The adjustment ratio for duty ratio in the present invention is uniquely determined according to how large first minimum pulse width Wpm1 is.

In the case where the adjustment ratio for duty ratio is set at 3% for the upper limit and lower limit, i.e., the ranges of duty ratios to be adjusted are set at 0%-3% as well as 97%-100% and VCO clock signal CKvco is set to have frequency f=500 KHz and cycle T1=2 μS, minimum pulse width Wpm1 of first minimum width pulse Pm1 is set as follows: Wpm1=T1× 3%=2 μs×0.03=60 ns.

FIG. 8(d) shows second minimum width pulse Pm2. Second minimum width pulse Pm2 is generated based on VCO clock signal CKvco by second minimum pulse width signal generating circuit 280 shown in FIGS. 4, 5. Rising edge trPm2 of second minimum width pulse Pm2 is in synchronism with falling edge tf of VCO clock signal CKvco and maximum value PsH of triangular wave signal Ps. Second minimum width pulse Pm2 is generated as follows. VCO clock signal CKvco is shaped in waveform into for example a triangular wave signal by means of resistor 282 and capacitor 284 shown in FIG. 5, and the signal thus shaped is thereafter used for generation thereof in the next stage, Schmitt trigger circuit 288. Minimum pulse width Wpm2 of second minimum width pulse Pm2 is determined by the magnitude of a so-called CR time constant of resistor 282 and capacitor 284. The adjustment ratio for duty ratio and the range of adjustment in the present invention are uniquely determined according to how large minimum pulse width Wpm2 is.

The PWM signal having a duty ratio of around 0% is in association with falling edge tf of VCO clock signal CKvco, as described with respect to FIG. 7(h). Hence, second minimum width pulse Pm2 is generated in synchronism with falling edge tf of VCO clock signal CKvco in order to control and adjust the PWM signal having a duty ratio of around 0%. Second minimum width pulse Pm2 is generated as follows. VCO clock signal CKvco is shaped in waveform into a triangular wave by means of resistor 282 and capacitor 284 shown in FIG. 5, and the signal thus shaped is thereafter used for generation thereof in Schmitt trigger circuit 288. The specific size of second minimum pulse width Wpm2 is as large as that of minimum pulse width Wpm1, so explanation therefor is not given. The adjustment ratio for duty ratio and the range of adjustment in the present invention are uniquely determined according to how large second minimum pulse width Wpm2 is, as with first minimum pulse width Wpm1. When first minimum pulse width Wpm1 and second minimum pulse width Wpm2 are set to the same width, Wpm, and the cycle of VCO clock signal CKvco is considered as T1, the adjustment ratio for duty ratio Dcont can be substantially expressed by Dcont=(Wpm/T1)×100%. In this case, the ranges of adjustment of duty ratio Drange1, Drange2 can be respectively expressed by Drange1=(0 to Dcont) %, Drange2=((100−Dcont) to 100) %. For example, when adjustment ratio Dcont=3% is set, range of adjustment Drange1 is 0%-3% and range of adjustment Drange2 is 97%-100%. As such, PWM signals having duty ratios falling within the ranges of 0%-3% and 97%-100% are subjected to the adjustment of duty ratio.

FIG. 8(e) shows first switch control signal Csw for driving latch circuit 210. First switch control signal Csw is extracted from node N34 shown in FIG. 5, i.e., the output terminal of NOT-OR (NOR) circuit 274. First switch control signal Csw is generated by NOT-OR processing of first minimum width pulse Pm1 and second minimum width pulse Pm2 shown in FIGS. 8(c), (d). First switch control signal Csw has pulse width Wsw substantially equal to pulse width Wpm1 of first minimum width pulse. Latch circuit 210 is configured to write the data, i.e., the PWM signal when first switch control signal Csw transitions from the low level to the high level, and is configured to hold the PWM signal when it transitions from the high level to the low level. Latch circuit 210 may be driven in response to transition made in an opposite manner.

FIG. 8(f) shows second switch control signal XCsw for driving latch circuit 210. Second switch control signal XCsw is extracted from node N34 shown in FIG. 5, i.e., the output terminal of NOT-OR (NOR) circuit 274. Second switch control signal XCsw has pulse width Wsw2 substantially equal to pulse width Wpm2 of the second minimum width pulse. Second switch control signal XCsw has a polarity opposite to that of first switch control signal Csw shown in FIG. 8(e), and they are in a complementary relation with each other. When second switch control signal XCsw transitions from the high level to the low level, latch circuit 210 writes the data, i.e., the PWM signal, whereas when it transitions from the high level to the low level, latch circuit 210 holds the PWM signal. It is one of matters of design choice for one having ordinary skills in the art to control latch circuit 210 at what timings of first, second switch control signals Csw, XCsw.

FIG. 8(g) schematically shows PWM signal P100 received at input terminal 202 of duty ratio adjusting circuit 200 shown in FIG. 5. For ease of description and drawing, PWM signal P100 in FIG. 8(g) is schematically indicated as a PWM signal having a duty ratio of around 100%. PWM signal P100 is in synchronism with rising edge tr of VCO clock signal CKvco.

FIG. 8(h) shows PWM signal Pn1 at the output of inverter 204 connected to input terminal 202 shown in FIG. 5, i.e., at node N1. Specifically, FIG. 8(h) shows an inverted signal of the PWM signal shown in FIG. 8(g), i.e., having a duty ratio of around 100%. The pulse width of the signal shown in FIG. 8(h) is very small in waveform, so it seems that the signal has a duty ratio of around 0% but it should be appreciated that the signal is actually an inverted signal of the PWM signal shown in FIG. 8(g), i.e., having a duty ratio of around 100%.

FIG. 8(i) shows latch output signal Pn4 from latch circuit 210. When PWM signal Pn1, having a relatively small pulse width as indicated by pulse width Wpm1 in FIG. 8(h), is extracted to node N4 corresponding to the output terminal of latch circuit 210, the pulse width thereof is expanded to pulse width Wpn4 as shown in FIG. 8(i) and then it is output. Increase in pulse width by the expansion, (Wpn4-Wpn1), is substantially as large as minimum pulse widths Wpm1, Wpm2 of the first, second minimum width pulses. In other words, FIG. 8(i) shows that the PWM signal having a duty ratio smaller than minimum pulse widths Wpm1, Wpm2 is expanded to have a pulse width as large as minimum pulse widths Wpm1, Wpm2. Latch output signal Pn4 shown in FIG. 8(i) is the PWM signal having a duty ratio of around 100% as described above. Although the duty ratio thereof is supposed to be smaller as pulse width Wpn4 is larger, it can be seen that pulse width Wpn4 is larger than pulse width WPn1 as apparent from comparison of those in FIGS. 8(h), (i). This indicates that the duty ratio, which was initially around 100%, is adjusted to be reduced. The pulse width thus reduced is substantially as large as minimum pulse widths Wpm1, Wpm2. As described above, when first, second minimum pulse widths Wpm1, Wpm2 are set to be for example 3% of cycle T1 of VCO clock signal CKvco, the PWM signal having a duty ratio of around 100% is reduced in duty ratio by approximately 3%, thereby adjusting the duty ratio thereof to approximately 97%.

As described above, FIG. 8(g), FIG. 8(h), and FIG. 8(i) schematically show the PWM signals each having a duty ratio of around 100%. The waveforms therein are in association with rising edge tr of VCO clock signal CKvco shown in FIG. 8(b).

The same holds true for the PWM signal having a duty ratio of around 0%, as the one having a duty ratio of around 100%. Namely, the case of the duty ratio of around 0% can be considered the same as the case of the duty ratio of around 100%, by shifting the waveforms of the signals of FIGS. 8(h), (i) to synchronize with falling edge tf of VCO clock signal CKvco shown in FIG. 8(b). In this case, a PWM signal having a duty ratio of 0%-3% is uniformly adjusted to be a PWM signal having a duty ratio of 3%.

FIG. 8(j) shows VCO clock signal XCKvco, which is a polarity-inverted signal of VCO clock signal CKvco shown in FIG. 8(b). VCO clock signal XCKvco is substantially the same as the signal at the output of inverter 254 connected to input terminal 252 that receives VCO clock signal CKvco as shown in FIG. 5, i.e., at node N21, and is the same as the signal received at the second input terminal of NOT-AND (NAND) circuit 216. VCO clock signal XCKvco is prepared to generate set pulse Pset and reset pulse Preset of RS flip-flop 220.

Set pulse Pset shown in FIG. 8(k) is prepared to set a circuit operation of RS flip-flop 220. Set pulse Pset is generated by NOT-AND (NAND) circuit 216 performing processing for a negative logical product of latch output signal Pn4 and VCO clock signal XCKvco shown in FIG. 8(i) and FIG. 8(j). RS flip-flop 220 operates in synchronism with rising edge tfn9 of set pulse Pset.

Reset pulse Preset shown in FIG. 8(l) is prepared to reset the circuit operation of RS flip-flop 220. Reset pulse Preset is generated by NOT-AND (NAND) circuit 226 performing processing for a negative logical product of respective inverted signals of latch output signal Pn4 and VCO clock signal XCKvco shown in FIG. 8(i) and Fig. (j). Reset pulse Preset is substantially equal to one obtained through (OR) processing for a logical sum of latch output signal Pn4 and VCO clock signal XCKvco, and is therefore a signal as shown in FIG. 8(l). In synchronism with falling edge tfn10 of reset pulse Preset, RS flip-flop 220 operates.

PWM signal Pn11 shown in FIG. 8(m) is a PWM signal sent from RS flip-flop 220 shown in FIG. 5 to node N11. PWM signal Pn11 is generated in RS flip-flop 220 as a result of set and reset done according to set pulse Pset and reset pulse Preset shown in FIGS. 8(k) and (1) respectively. Accordingly, the PWM signal shown in FIG. 8(m) is extracted. It should be noted that PWM signal Pn11 shown in FIG. 8(n) is substantially the same as latch output signal Pn4 shown in FIG. 8(i) although it has a signal polarity opposite thereto.

A second minimum width pulse signal Pn32 shown in FIG. 8(n) is a signal at node N32, and this signal is substantially the same as a polarity-inverted signal of second minimum width pulse Pm2 shown in FIG. 8(d).

A PWM signal Pn12 shown in FIG. 8(o) is a signal at node N12, i.e., the output terminal of inverter 232. PWM signal Pn12 is substantially the same as PWM signal Pn11 extracted at the output terminal of RS flip-flop 220, i.e., node N11 and shown in FIG. 8(m).

PWM signal P290 shown in FIG. 8(p) is an output signal of duty ratio adjusting circuit 200 to output terminal 290. Output terminal 290 receives both a PWM signal having a duty ratio adjusted and a PWM signal having a duty ratio not adjusted.

It can be readily appreciated by comparison with FIG. 8(g) how much the duty ratio of PWM signal P290 shown in FIG. 8(p) is adjusted. Specifically, FIG. 8(g) schematically shows PWM signal P100 having a duty ratio of around 100% and having a pulse width represented by Wp100. It can be seen that after the duty ratio of PWM signal P100 is adjusted, PWM signal P100 has a smaller (narrower) pulse width Wpm100 as shown in FIG. 9(p) than pulse width Wp100 of PWM signal P100 having not been subjected to the adjustment of duty ratio yet. The duty ratio is adjusted as such. A differential pulse width ΔWp therebetween is accordingly smaller as follows: ΔWp=(Wp100-Wpm100). Differential pulse width ΔWp is equal to minimum pulse width Wpm1 of first minimum width pulse P1 shown in FIG. 8(c). Here, minimum pulse width Wpm1 of first minimum width pulse P1 falls within a range of 0%-5% of cycle T1 of VCO clock signal CKvco, and is preferably approximately 3%. Accordingly, the adjustment ratio for duty ratio is 3%, and the range of duty ratio to be adjusted is 97%-100%.

As described above, FIG. 8 illustrates the case where the duty ratio is around 100%, but a case where the duty ratio is around 0% can be considered in a similar way. Specifically, when the duty ratio of the PWM signal is around 0%, the range of adjustment for duty ratio is 0%-3%. It should be noted that when the duty ratio of the PWM signal exceeds first, second minimum width pulses Wpm1, Wpm2, the duty ratio thereof is not adjusted, and the PWM signal accordingly has a duty ratio unchanged from the duty ratio that it had upon being input to input terminal 202 and is then sent to output terminal 290.

As described above, PWM circuit 150 processes PWM signals having duty ratios falling within a first duty ratio range of 0%400%, whereas duty ratio adjusting circuit 200 adjusts the duty ratios thereof to fall within a range narrower than the first duty ratio, for example, a range of 3% (or 5%) to 97% (or 95%).

Figure 9:
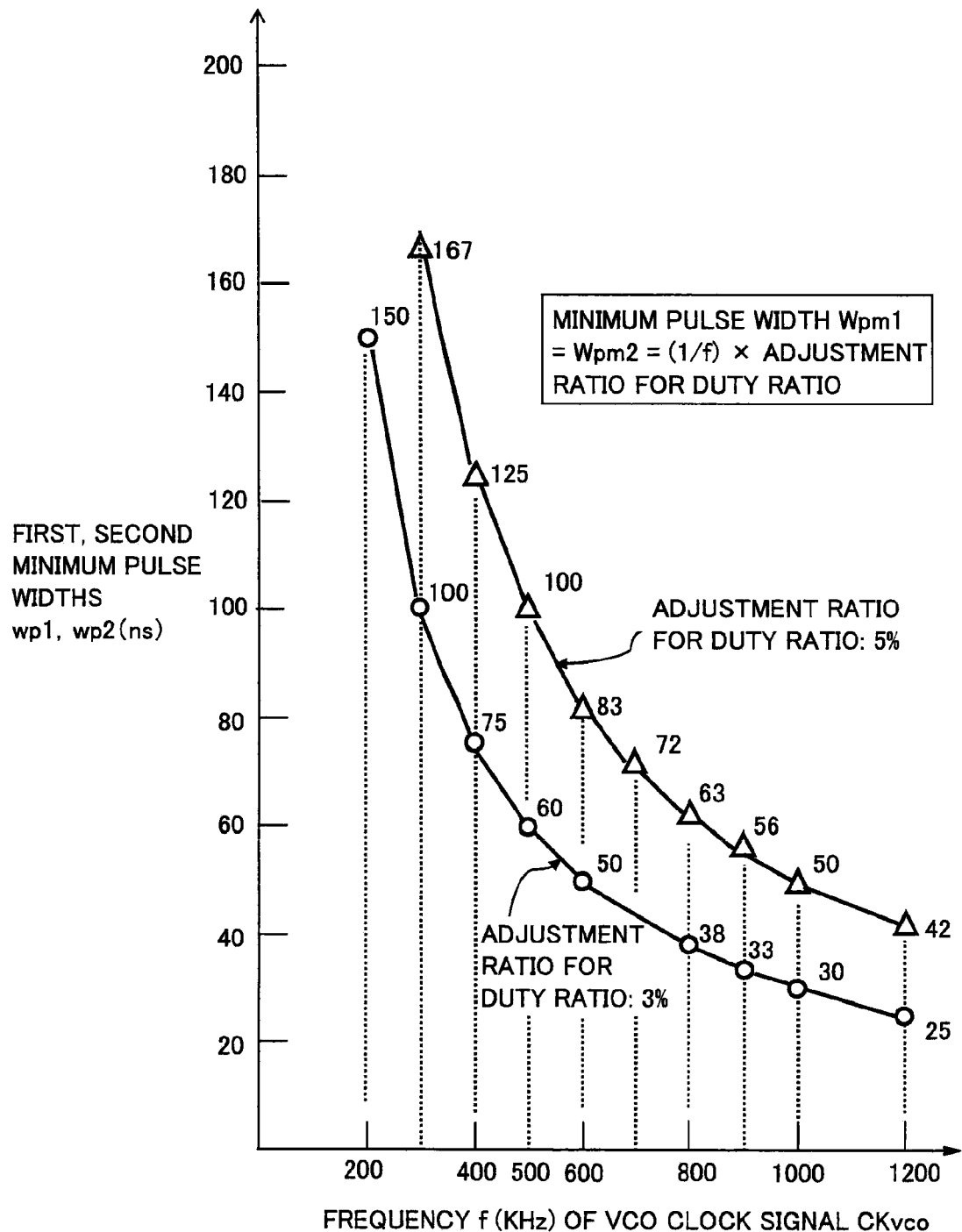
FIG. 9 shows a relation between a minimum pulse width provided by the duty ratio adjusting circuit according to the present invention and a frequency of a VCO clock signal CKvco.

FIG. 9 shows a relation between the minimum pulse width provided by the duty ratio adjusting circuit and the frequency of VCO clock signal CKvco. Specifically, FIG. 9 shows to what extent first minimum pulse width Wpm1 and second minimum pulse width Wpm2 should be adjusted in accordance with frequency f of VCO clock signal CKvco. First minimum pulse width Wpm1 and second minimum pulse width Wpm2 are provided by first minimum pulse width signal generating circuit 260 and second minimum pulse width signal generating circuit 280 both provided in duty ratio adjusting circuit 200. In particular, FIG. 9 shows cases where the adjustment ratio for duty ratio is 3% and 5%. First minimum pulse width Wpm1 and second minimum pulse width Wpm2 are determined as follows. First, second minimum widths Wp1, Wp2 are expressed by: Wp1=Wp2=T1×the adjustment ratio for duty ratio=(1/f)×the adjustment ratio for duty ratio, where f represents the frequency of VCO clock signal CKvco and T1 represents the cycle thereof. Accordingly, assuming that the adjustment ratio for duty ratio is 3% and 5% when frequency f of VCO clock signal CKvco is 500 KHz, first, second minimum widths Wp1, Wp2 are respectively 60 ns and 100 ns. In addition, when frequency f of VCO clock signal CKvco is 1 MHz (1000 KHz), first, second minimum widths Wp1, Wp2 are respectively 30 ns and 50 ns.

Figure 10:
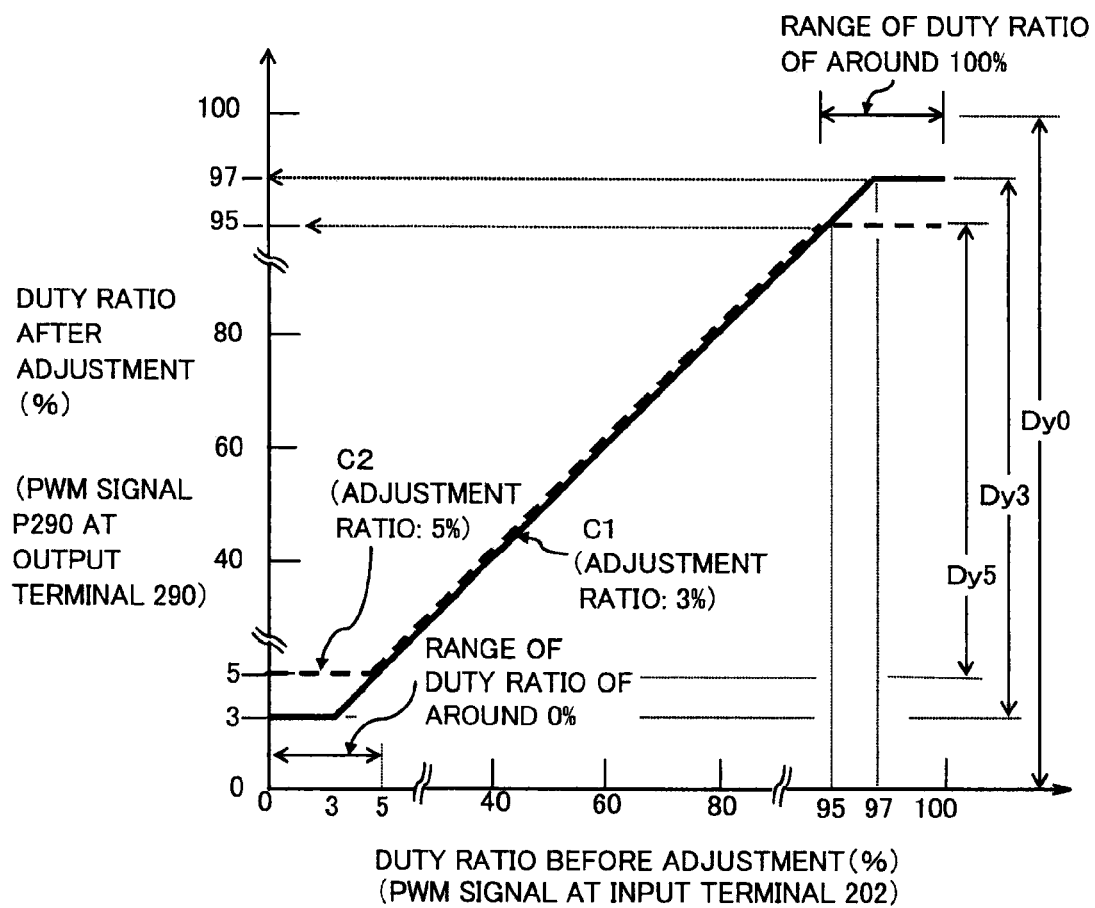
FIG. 10 shows a range of duty ratio to be adjusted by the duty ratio adjusting circuit according to the first embodiment of the present invention.

FIG. 10 shows ranges of duty ratio to be adjusted by duty ratio adjusting circuit 200. In FIG. 10, it is assumed that the duty ratio of around 100% is in a range of 95%-100% and the duty ratio of around 0% is in a range of 0%-5%. The horizontal axis thereof represents the output signal of PWM circuit 150, i.e., the PWM signal provided to input terminal 202 of duty ratio adjusting circuit 200, whereas the vertical axis thereof represents PWM signal P290 having an adjusted duty ratio and provided to output terminal 290 of duty ratio adjusting circuit 200 as described in the left side thereof FIG. 10 shows that when the adjustment ratio for duty ratio is 3%, PWM signals each having a duty ratio of 0%-3% are uniformly adjusted to be PWM signals each having a duty ratio of 3% and PWM signals each having a duty ratio of 97%-100% are uniformly adjusted to be PWM signals P290 each having a duty ratio of 97%, as indicated by a reference character C1. Also, FIG. 10 schematically shows that when the adjustment ratio for duty ratio is 5%, PWM signals each having a duty ratio of 0%-5% are uniformly adjusted to be PWM signals each having a duty ratio of 5% and PWM signals each having a duty ratio of 95%-100% are uniformly adjusted to be PWM signals each having a duty ratio of 95%, as indicated by a reference character C2.

FIG. 10 also schematically shows how the dynamic range of entire class D power amplifier 100 is changed by the adjustment of duty ratio, as illustrated in the right side of the vertical axis. Specifically, when a duty ratio is not adjusted, dynamic range Dy0 thereof is equivalent to the dynamic range obtained when no duty ratio adjusting circuit 200 is provided, so dynamic range Dy0=100%. As the adjustment ratio for duty ratio is larger, the dynamic range is narrower. FIG. 10 schematically shows that a dynamic range Dy3 when the adjustment ratio for duty ratio is 3% is narrower than that when the adjustment ratio is 0%, and a dynamic range Dy5 when the adjustment ratio for duty ratio is 5% is narrower than that when the adjustment ratio is 3%. More specifically, assuming that a maximum output signal is 10 Vpp when the adjustment ratio is 0%, the maximum output signal is reduced by approximately 10% when the adjustment ratio for duty ratio is set at 5%, whereby the maximum output signal has an amplitude value of 9 Vpp. Meanwhile, when the adjustment ratio for duty ratio is 3%, the maximum output signal is reduced by approximately 6%, whereby the maximum output signal has an amplitude attenuated to 9.4 Vpp. Hence, when adopting duty ratio adjusting circuit 200 according to the present invention, the adjustment ratio for duty ratio is to be determined in consideration of a purpose of use of class D power amplifier 100 as well as a maximum output to be generated.

Second Embodiment

Figure 11:
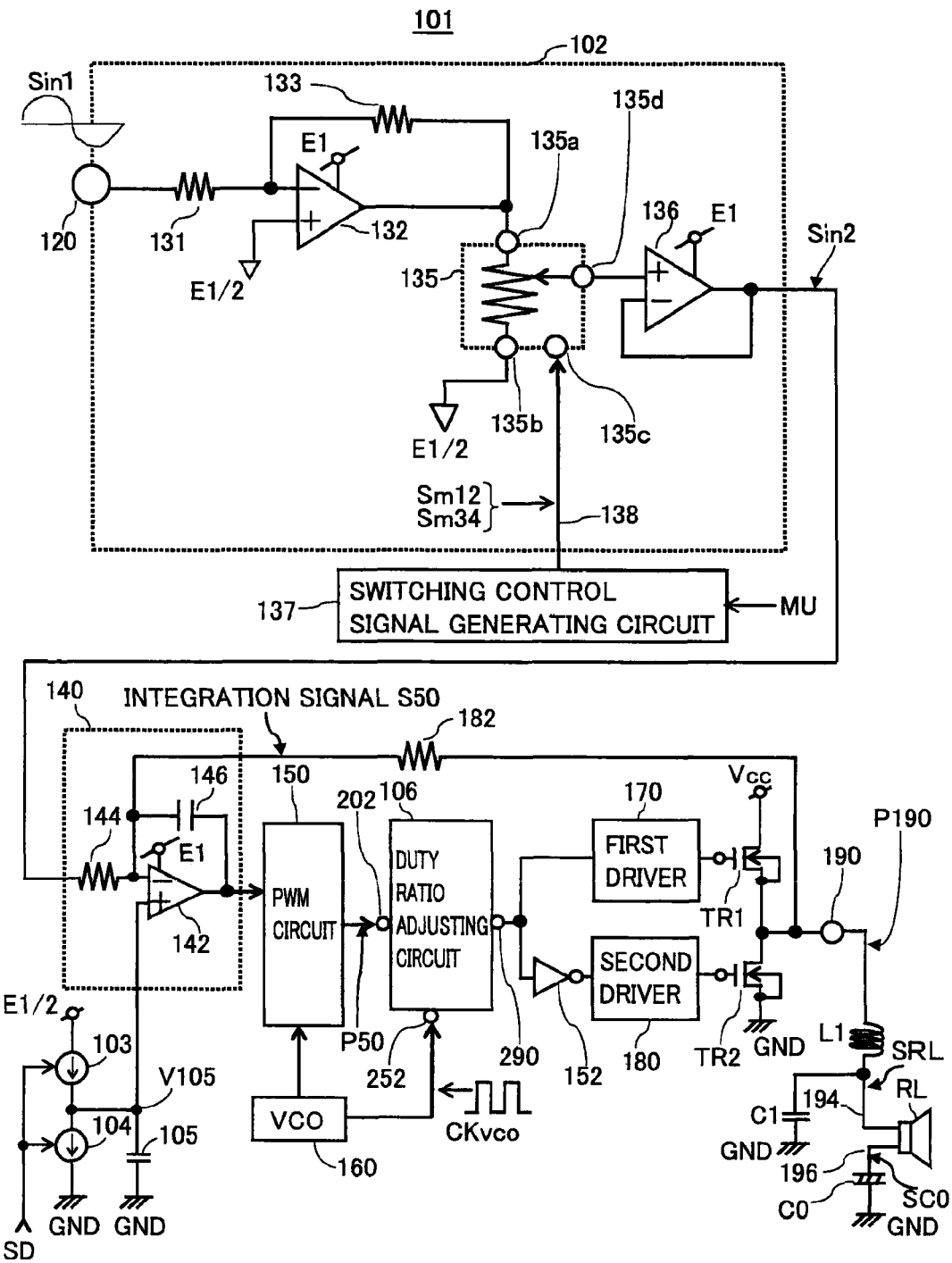
FIG. 11 shows a circuit block diagram of a class D power amplifier according to a second embodiment of the present invention.

FIG. 11 is a circuit block diagram showing a configuration of a class D power amplifier 101 according to a second embodiment of the invention of the present application, in comparison to FIG. 1. FIG. 12(a)-FIG. 12(d) are signal waveform diagrams showing operations of class D power amplifier 101. Referring to FIG. 11, class D power amplifier 101 is different from class D power amplifier 100 of FIG. 1 in that an analog signal processing unit 102 replaces analog signal processing unit 130, current sources 103, 104, and a capacitor 105 are additionally provided, and a duty ratio adjusting circuit 106 replaces duty ratio adjusting circuit 200.

Figure 12:
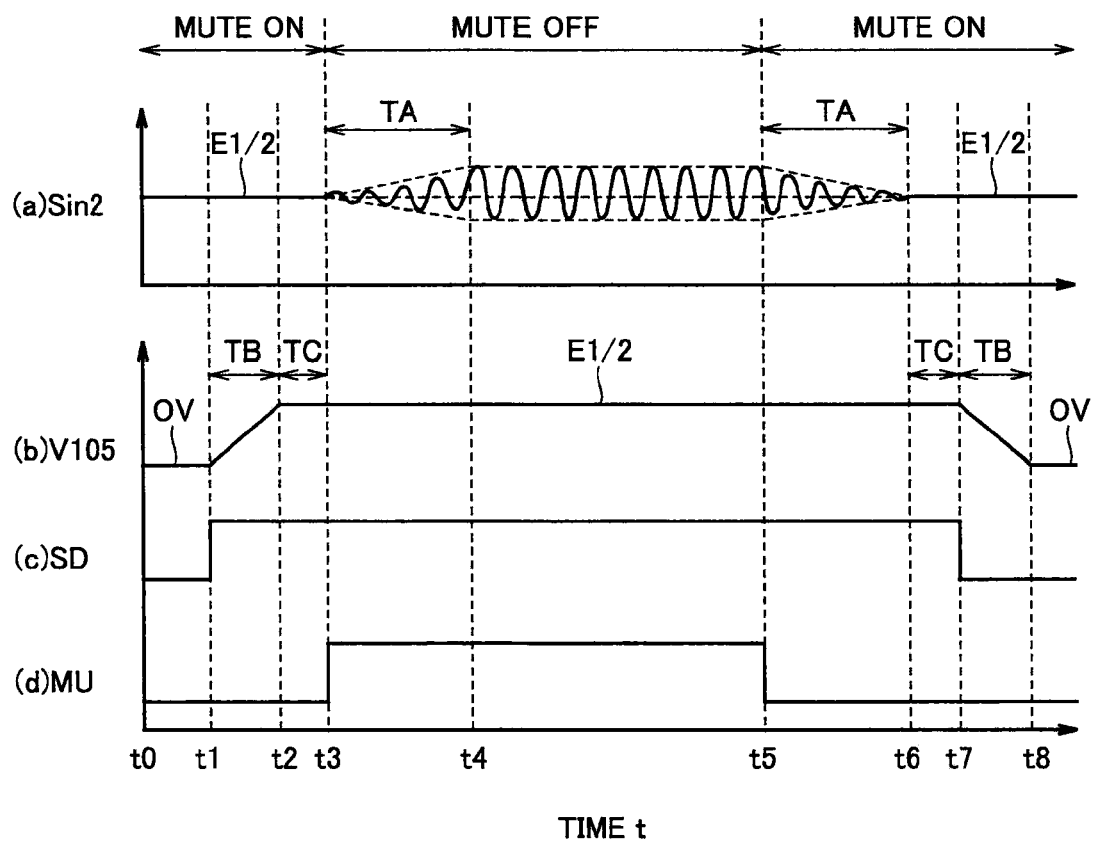
FIG. 12 is a waveform diagram of signals in main portions of FIG. 11 in the second embodiment of the present invention.
Figure 13:
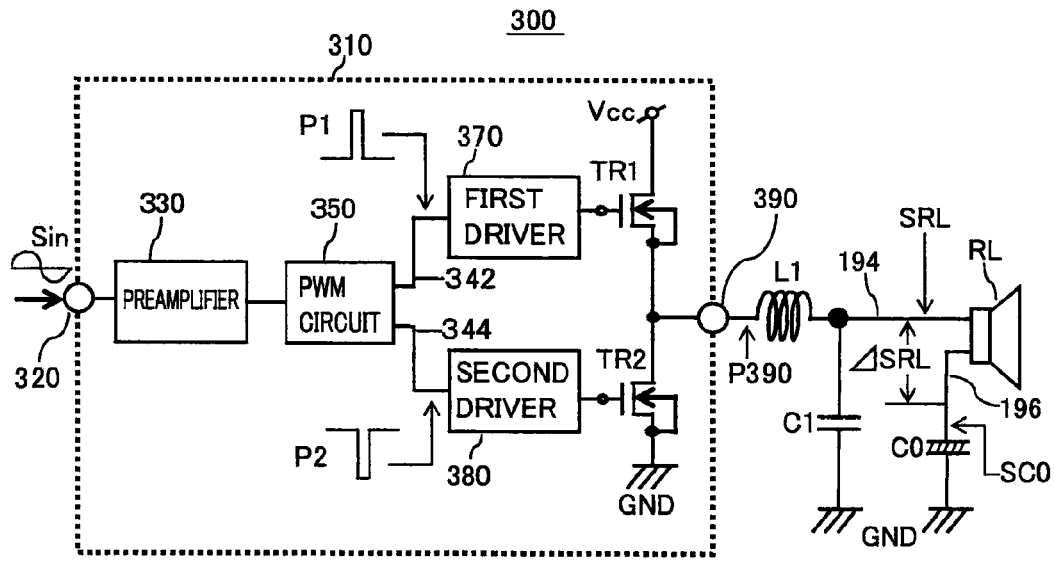
FIG. 13 is a circuit block diagram of a conventional class D power amplifier.
Figure 14:
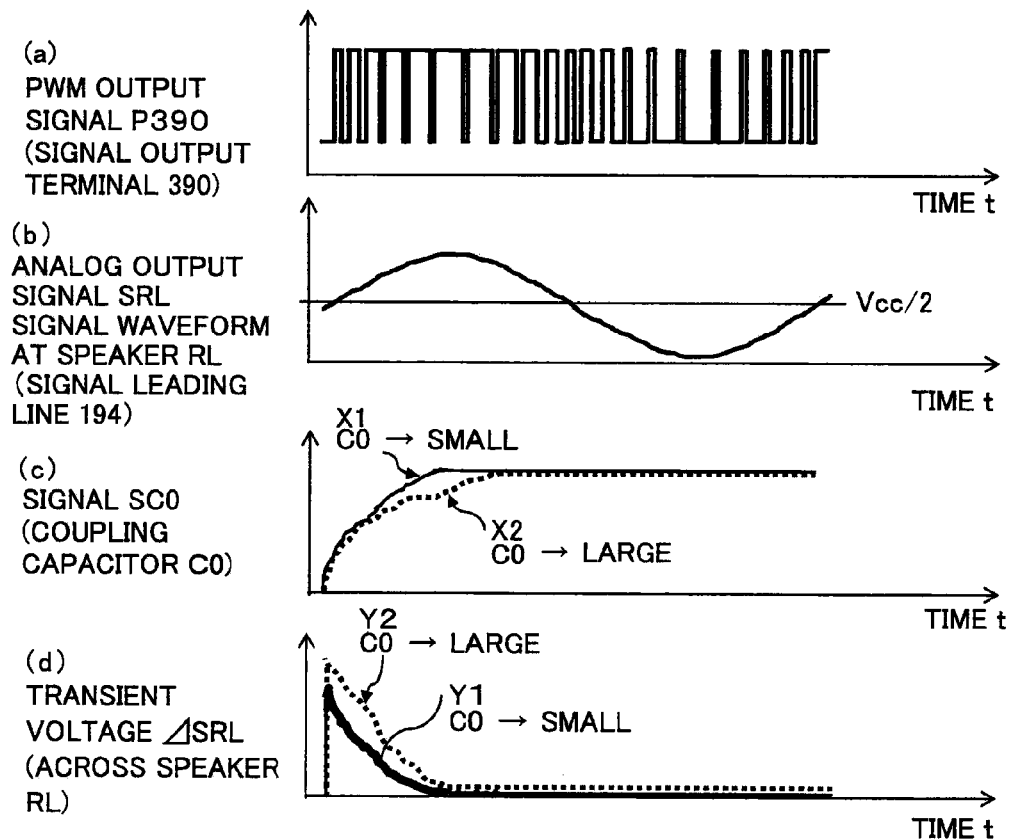
FIG. 14 is a waveform diagram of signals in a speaker and a coupling capacitor provided in the conventional class D power amplifier and shown in FIG. 13.
Figure 15:
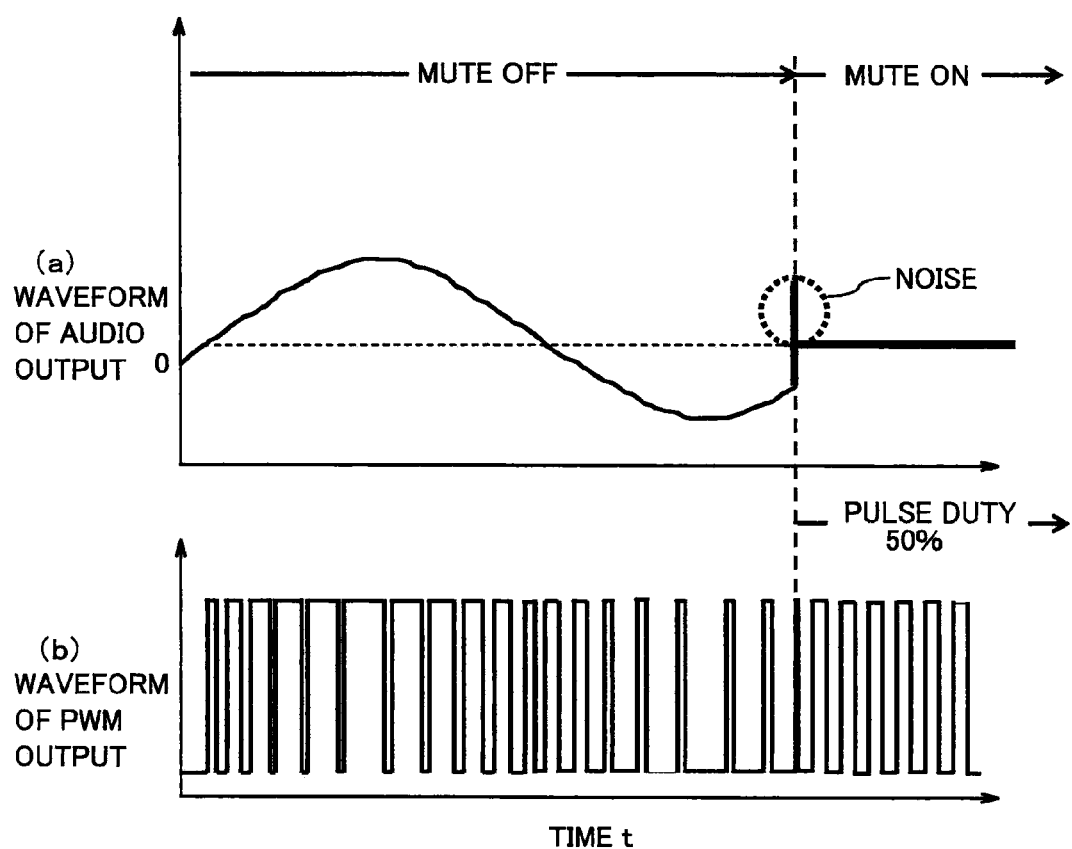
FIG. 15 is a signal waveform diagram illustrating how noise occurs when switching a mode from mute-off to mute-on conventionally.

Analog signal processing unit 102 is obtained by removing amplifier 134 from analog signal processing unit 130. Signal switching circuit 135 has a second terminal 135b to which a direct current voltage E1/2, which is the half of power source voltage E1, is applied. Signal switching circuit 135 is constituted by, for example, a variable voltage dividing circuit. As shown in FIGS. 12(a), (d), when a control signal MU is at the low level (time t0-t3), the voltage dividing ratio of signal switching circuit 135 is set at 0, direct current voltage E1/2 is directly provided to amplifier 136 via signal switching circuit 135, and output voltage Sin2 of amplifier 136 is fixed to direct current voltage E1/2.

Control signal MU is a signal that is brought into the low level upon mute-on and is brought into the high level upon mute-off. When control signal MU rises from the low level to the high level (time t3), the voltage dividing ratio of signal switching circuit 135 is gradually increased according to signal Sm12 from 0 to 1 for predetermined time TA (time t3-t4). In this way, output voltage Sin2 of amplifier 136 is gradually changed from direct current voltage E1/2 to have a waveform in which analog signal Sin1 is superimposed on direct current voltage E1/2. During mute-off, the voltage dividing ratio of signal switching circuit 135 is fixed to 1.

When control signal MU falls from the high level to the low level (time t5), the voltage dividing ratio of signal switching circuit 135 is gradually decreased according to signal Sm34 from 1 to 0 for predetermined time TA (time t5-t6). In this way, output voltage Sin2 of amplifier 136 is gradually changed to direct current voltage E1/2 from the voltage with the waveform in which analog signal Sin1 is superimposed on direct current voltage E1/2. During mute-on, the voltage dividing ratio of signal switching circuit 135 is fixed to 0.

Further, current source 103 is connected between a node of direct current voltage E1/2 and a non-inverting input terminal (+) of amplifier 142, supplies current of a specific value when a control signal SD is at the high level, and stops supplying current when control signal SD is at the low level. Current source 104 is connected between the non-inverting input terminal (+) of amplifier 142 and a node of ground potential GND (0V), stop supplying current when control signal SD is at the high level, and supplies current of a specific value when control signal SD is at the low level. Capacitor 105 is connected between the non-inverting input terminal (+) of amplifier 142 and the node of ground potential GND (0V).

Control signal SD is at the low level during mute-on. When switching from mute-on to mute-off, control signal SD rises to the high level at time (for example t1) earlier by predetermined time (TB+TC) than the time (for example, t3) at which control signal MU rises to the high level. Further, control signal SD is at the high level during mute-off When switching from mute-off to mute-on, control signal SD falls to the low level at time (for example, t7) later by predetermined time (TA+TC) than the time (for example, t5) at which control signal MU falls to the low level.

During mute-on (time t0-t1), control signal SD is at the low level, current source 103 stops supplying current, current source 104 supplies current, and voltage V105 across capacitor 105 is 0V. Then, when control signal SD rises from the low level to the high level (time t1), current source 103 supplies current, current source 104 stops supplying current, and voltage V105 across capacitor 105 is gradually increased and reaches direct current voltage E1/2 after passage of predetermined time TB. During mute-off, voltage V105 across capacitor 105 is maintained at direct current voltage E1/2. At time (time t7) after passage of predetermined time (TA+TC) since the switching from mute-off to mute-on, control signal SD falls to the low level. Accordingly, current source 103 stops supplying current, current source 104 supplies current, and voltage V105 across capacitor 105 is gradually decreased and reaches 0V after passage of predetermined time TB (time t8).

It should be noted that the non-inverting input terminal (+) and inverting input terminal (−) of amplifier 142 are maintained at the same voltage, so the direct-current component of analog signal SRL supplied to speaker RL is the same as voltage V105 across capacitor 105.

Duty ratio adjusting circuit 106 always maintains the duty ratio at 1.5% or higher. For example, assuming that one cycle of PWM signal P50 sent from PWM circuit 150 is 2 µsec, the pulse width of each pulse of PWM signal P50 is adjusted to at least 30 nsec by duty ratio adjusting circuit 106. If duty ratio adjusting circuit 106 is not provided and circuit delay occurs, the pulses of PWM signal P50 are not output periodically during period of time (time t1-t2) in which voltage V105 across capacitor 105 is gradually increased from 0V to direct current voltage E1/2. This results in occurrence of popping noise. Further, during mute-off, duty ratio adjusting circuit 106 may have the same function as that of duty ratio adjusting circuit 200.

Next, operations of class D power amplifier 101 will be described. During mute-on, control signals SD, MU are both fixed at the low level, output voltage Sin2 of amplifier 136 is fixed to direct current voltage E1/2, and voltage V105 across capacitor 105 is fixed to 0 V. During this period (time t0-t1), analog signal SRL is fixed to 0 V and no sound comes out from speaker RL.

When a user of class D power amplifier 101 instructs mute-off, control signal SD first rises from the low level to the high level (time t1). When control signal SD is brought into the high level, current source 103 supplies current, current source 104 stops supplying current, and voltage V105 across capacitor 105 is gradually increased from 0V to direct current voltage E1/2 for predetermined time TB. On this occasion, no popping noise comes out from speaker RL because analog signal SRL is gradually increased according to voltage V105.

At time (time t3) after passage of predetermined time TC since voltage V105 reached constant voltage E1/2, control signal MU rises from the low level to the high level. When control signal MU is brought into the high level, the voltage dividing ratio of signal switching circuit 135 is gradually increased from 0 to 1 for predetermined time TA, thus gradually increasing an alternating current component of output voltage Sin2 of amplifier 136. Voltage Sin2 is converted into a PWM signal, which is provided to output terminal 190 and is then converted into analog signal SRL by the low pass filter constituted by inductor L1 and capacitor C1. During mute-off, analog signal SRL has the same waveform as that of output voltage Sin2 of amplifier 136. On this occasion, the direct-current component of output voltage Sin2 of amplifier 136 is fixed, so the alternating current component is not distorted in waveform. Thus, sound is not deteriorated.

When a user of class D power amplifier 101 instructs mute-on, control signal MU falls from the high level to the low level (time t5). When control signal MU is brought into the low level, the voltage dividing ratio of signal switching circuit 135 is gradually decreased from 1 to 0 for predetermined time TA, and the alternating current component of output voltage Sin2 of amplifier 136 is gradually attenuated, whereby voltage Sin2 becomes constant voltage E1/2 (time t6). On this occasion, the direct-current component of output voltage Sin2 of amplifier 136 is fixed, so the alternating current component thereof is not distorted in waveform. Thus, sound is not deteriorated.

After passage of predetermined time TC since voltage Sin2 became direct current voltage E1/2, control signal SD falls from the high level to the low level (time t7). When control signal SD is brought into the low level, current source 103 stops supplying current, current source 104 supplies current, and voltage V105 across capacitor 105 is gradually decreased from direct current voltage E1/2 to 0V for predetermined time TB. On this occasion, no popping noise comes out from speaker RL because analog signal SRL is gradually decreased according to voltage V105.

Further, duty ratio adjusting circuit 106 maintains the duty ratio of a PWM signal at 1.5% or greater. Hence, no popping noise occurs due to the pulses of PWM signal P50 being not periodically output from PWM circuit 150.

In the second embodiment, in addition to the same effect as that of the first embodiment, distortion in the waveform of analog voltage Sin2 can be reduced, thereby reducing deterioration of sound.

It should be considered that the embodiments disclosed herein are illustrative and non-restrictive in any respect. The scope of the present invention is defined by the scope of claims, and is intended to include any modifications within the scope and meaning equivalent to the terms of the claims.

INDUSTRIAL APPLICABILITY

The present invention provides a class D power amplifier achieving elimination of popping noise, which is likely to occur when switching is made between mute-on/off and when a PWM signal has a duty ratio of around 0% and 100%. As such, the present invention is highly applicable industrially.

DESCRIPTION OF THE REFERENCE SIGNS 100, 101, 300: class D power amplifier; 103, 104: current source; 120, 320: signal input terminal; 102, 130: analog signal processing unit; 131, 133, 144, 262, 282: resistor; 132, 134, 136, 142: amplifier; 135: signal switching circuit; 135a: first terminal; 135b: second terminal; 135c: control terminal; 135d: output terminal; 137: switching control signal generating circuit; 140: integrating circuit; 138, 194, 196, 342, 344: signal leading line; 105, 146, 264, 284, C1: capacitor; 150, 350: PWM circuit; 152, 204, 211, 212, 213, 214, 215, 217, 218, 232, 254, 256, 258, 273, 275, 286, 293, 294, 296, 297: inverter; 160: VCO; 170, 370: first driver; 180, 380: second driver; 182: feedback resistor; 190, 390: signal output terminal; 106, 200: duty ratio adjusting circuit; 202, 252: input terminal; 206, 208: transfer gate; 216, 222, 224, 226, 272, 292, 295: NOT-AND (NAND) circuit; 220: RS flip-flop; 228, 274: NOT-OR (NOR) circuit; 260: first minimum pulse width signal generating circuit; 268, 288: Schmitt trigger circuit; 280: second minimum pulse width signal generating circuit; 290: output terminal; 310: integrated circuit portion; 330: preamplifier; C0: coupling capacitor; L1: inductor; N1, N2, N3a, N3b, N4, N5, N6a, N6b, N7, N8, N9, N10, N11, N12, N21, N22, N23, N24, N25, N26, N27, N28, N29, N30, N31, N32, N33, N34, N35: node; RL: speaker; TR1, TR2: power transistor.

What is claimed is:

1. A class D power amplifier comprising: a signal input terminal for receiving an analog input signal; an analog signal processing unit, connected to said signal input terminal, for processing said analog signal; an integrating circuit for integrating the analog signal output from said analog signal processing unit; a PWM circuit for providing pulse width modulation (PWM) to an integration signal output from said integrating circuit, so as to generate a PWM signal; and a signal output terminal via which the pulse width modulation signal generated by said PWM circuit is output, said analog signal processing unit including: a first amplifier, connected to said signal input terminal, for amplifying said analog input signal; a second amplifier for outputting a direct current voltage as an output signal; a signal switching circuit, which has first and second terminals for receiving the output signals of said first amplifier and said second amplifier respectively and to which a switching control signal having a predetermined time is applied; and a third amplifier having an input terminal and an output terminal respectively connected to an output terminal of said signal switching circuit and said integrating circuit, the output signal of one of said first amplifier and said second amplifier being sent to said output terminal of said third amplifier in accordance with said switching control signal.

2. The class D power amplifier according to claim 1, wherein said switching control signal is one of a staircase wave signal, a sawtooth wave signal, and a triangular wave signal.

3. The class D power amplifier according to claim 2, wherein said predetermined time of said switching control signal is 50 ms-150 ms.

4. The class D power amplifier according to claim 1, wherein the switching control signal is applied to said signal switching circuit so as to switch an operation mode to one of mute-on and mute-off.

5. The class D power amplifier according to claim 4, wherein when the operation mode is mute-on, said switching control signal controls said signal switching circuit such that the output signal of said second amplifier is transmitted to said third amplifier.

6. The class D power amplifier according to claim 4, wherein when the operation mode is mute-off, said switching control signal controls said signal switching circuit such that the output signal of said first amplifier is transmitted to said third amplifier.

7. A class D power amplifier comprising: a signal input terminal for receiving an analog input signal; an analog signal processing unit, connected to said signal input terminal, for processing said analog input signal; an integrating circuit for integrating the analog signal output from said analog signal processing unit; a PWM circuit for providing pulse width modulation to an integration signal output from said integrating circuit, so as to generate a pulse width modulation (PWM) signal having a duty ratio falling within a first duty ratio range; a VCO circuit for supplying a triangular wave signal to said PWM circuit and generating a VCO clock signal synchronized with said triangular wave signal; a duty ratio adjusting circuit for adjusting the duty ratio of the PWM signal sent via an output terminal of said PWM circuit to fall within a second duty ratio range narrower than said first duty ratio range; an output terminal via which an output signal of said duty ratio adjusting circuit is sent; and a driver circuit connected to said output terminal; a power transistor connected to said driver circuit; and a signal output terminal which is connected to said power transistor and via which the PWM signal output therefrom and having the duty ratio adjusted is output.

8. The class D power amplifier according to claim 7, wherein said first duty ratio range is 0%-100% and said second duty ratio range is 3%-97%.

9. The class D power amplifier according to claim 7, wherein said duty ratio adjusting circuit has a latch circuit for temporarily storing the PWM signal therein, and said latch circuit is constituted by one of a transfer gate, an NAND circuit, and a OR circuit.

10. The class D power amplifier according to claim 9, wherein said latch circuit is constituted by said transfer gate, said transfer gate has an input terminal, an output terminal, and a control terminal, said input terminal of said transfer gate receives said PWM signal, said control terminal receives a switch control signal having a predetermined adjustment ratio relative to said VCO clock signal, having a pulse width smaller than a cycle of said VCO clock signal, and synchronized with a rising edge and a falling edge of said VCO clock signal, and a latch output signal of said latch circuit is extracted via said output terminal.

11. The class D power amplifier according to claim 10, wherein said latch circuit has a first transfer gate, a second transfer gate, a first inverter, and a second inverter, each of said first, second transfer gates has an input terminal, an output terminal, and a control terminal, each of said first, second inverters has an input terminal and an output terminal, the two inverters are connected in series, the input terminal and output terminal of said first transfer gate are respectively connected to the output terminal of said PWM circuit and the input terminal of the first inverter, the output terminal of said first inverter is connected to the input terminal of said second inverter, the input terminal and output terminal of said second transfer gate are respectively connected to the output terminal of said second inverter and the output terminal of said first transfer gate, said switch control signal is applied to said control terminals of said first, second transfer gates, and the latch output signal is sent via a common connection point of said first inverter and said second inverter.

12. The class D power amplifier according to claim 11, wherein said switch control signal has a cycle T2, which is the half of a cycle T1 of said VCO clock signal.

13. The class D power amplifier according to claim 7, wherein said duty ratio adjusting circuit includes: a latch circuit for temporarily storing said PWM signal therein; a first logical circuit for receiving a latch output signal of said latch circuit and said VCO clock signal individually; a second logical circuit for receiving said latch output signal of said latch circuit and said VCO clock signal individually; an RS flip-flop for receiving respective output signals of said first and second logical circuits as a set signal and a reset signal; a minimum pulse width signal generating circuit for generating a minimum pulse width signal, which is set, based on said VCO clock signal, at a predetermined adjustment ratio relative to a cycle of said VCO clock signal; a third logical circuit for receiving an output signal of said RS flip-flop and an output signal of said minimum pulse width signal generating circuit individually; and a fourth logical circuit for receiving an output signal of said third logical circuit and a minimum width pulse generated by said minimum pulse width signal generating circuit individually.

14. The class D power amplifier according to claim 13, wherein each of said first, second, and fourth logical circuits is a NOT-AND (NAND) circuit, and said third logical circuit is a NOT-OR (NOR) circuit.

15. The class D power amplifier according to any one of claims 10 and 13, wherein said predetermined adjustment ratio is 0%-5%.

16. The class D power amplifier according to claim 15, wherein said predetermined adjustment ratio is 3%.

17. The class D power amplifier according to claim 13, wherein said minimum pulse width signal generating circuit has first and second minimum pulse width signal generating circuits for generating first and second minimum width pulses respectively.

18. The class D power amplifier according to claim 10, wherein said first, second minimum width pulses are combined to generate said switch control signal.

19. The class D power amplifier according to claim 17, wherein each of said first, second minimum pulse width generating circuits is constituted by an integrating circuit made up of a resistor and a capacitor, and a Schmitt trigger circuit to which an output signal of said integrating circuit is sent.

20. A class D power amplifier comprising: a signal input terminal for receiving an analog input signal; and an analog signal processing unit, connected to said signal input terminal, for processing said analog input signal, said analog signal processing unit including: a first amplifier, connected to said signal input terminal, for amplifying the analog signal; a second amplifier for outputting a predetermined direct current voltage; a signal switching circuit which has a first terminal and a second input terminal for receiving output signals of said first amplifier and said second amplifier, and which receives a switching control signal set at a predetermined time; and a third amplifier having an input terminal and an output terminal respectively connected to an output terminal of said signal switching circuit and an integrating circuit for integrating said analog signal, one of the output signals of said first amplifier and said second amplifier being sent to said output terminal of said third amplifier in accordance with said switching control signal after passage of said predetermined time, the class D power amplifier further comprising: a PWM circuit for providing pulse width modulation (PWM) to an integration signal output from said integrating circuit, so as to generate a PWM signal having a duty ratio falling within a first duty ratio range; a duty ratio adjusting circuit for adjusting the duty ratio of said PWM signal, which is an output signal of said PWM circuit, to fall within a second duty ratio range narrower than said first duty ratio range; a driver circuit which receives an output signal of said duty ratio adjusting circuit; a power transistor connected to said driver circuit; and a signal output terminal, which is connected to said power transistor and via which the PWM signal output therefrom and having the duty ratio adjusted is output.

21. The class D power amplifier according to claim 20, wherein power source voltages supplied to said first, second, third amplifiers and said integrating circuit are equal to one another, said second amplifier has a non-inverting input terminal to which a voltage equal to each of said power source voltages is provided, said second amplifier has an inverting input terminal and an output terminal connected to each other and connected to said second input terminal of said signal switching circuit, said third amplifier has a non-inverting input terminal connected to said output terminal of said signal switching circuit, said third amplifier has an inverting input terminal and an output terminal connected to each other and connected to an inverting input terminal of said integrating circuit via a resistor for integration, said integrating circuit has a non-inverting input terminal to which a predetermined direct current voltage is provided, and said integrating circuit has an output terminal connected to said PWM circuit.

22. The class D power amplifier according to any one of claims 1, 7, and 20, wherein a low pass filter for demodulating into an analog signal said PWM signal having been output, a speaker, and a coupling capacitor are connected to said signal output terminal in series.

* * * * *